US012740125B2

(12) United States Patent
Xie et al.

(10) Patent No.: US 12,740,125 B2
(45) Date of Patent: Sep. 15, 2026

(54) SEMICONDUCTOR STRUCTURE WITH EXTENDED BACKSIDE CONNECTIONS

(71) Applicant: International Business Machines Corporation, Armonk, NY (US)

(72) Inventors: Ruilong Xie, Niskayuna, NY (US); Lawrence A. Clevenger, Saratoga Springs, NY (US); Brent A. Anderson, Jericho, VT (US); Albert M. Chu, Nashua, NH (US); Nicholas Anthony Lanzillo, Wynantskill, NY (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 18/530,306

(22) Filed: Dec. 6, 2023

(65) Prior Publication Data

US 2025/0194210 A1 Jun. 12, 2025

(51) Int. Cl.
*H10D 64/23* (2025.01)
*H10D 30/43* (2025.01)
(Continued)

(52) U.S. Cl.
CPC ........... *H10D 64/254* (2025.01); *H10D 30/43* (2025.01); *H10D 30/6735* (2025.01);
(Continued)

(58) Field of Classification Search
CPC .. H10D 64/254; H10D 30/43; H10D 30/6735; H10D 30/6757; H10D 62/121;
(Continued)

(56) References Cited

U.S. PATENT DOCUMENTS 11,195,930 B1 12/2021 Chen et al.
2021/0111115 A1 4/2021 Morrow et al.
(Continued)

FOREIGN PATENT DOCUMENTS

WO 2021070367 A1 4/2021

*Primary Examiner* — Fernando L Toledo
*Assistant Examiner* — Shawn Shaw Muslim
(74) *Attorney, Agent, or Firm* — Cantor Colburn LLP; Samuel Waldbaum

(57) ABSTRACT

A semiconductor structure with extended backside connections is provided. In one embodiment, the semiconductor structure includes a set of backside source/drain contacts, wherein the set of backside source/drain contacts include a first backside source/drain contact, a second backside source/drain contact, and a third backside source/drain contact, a gate that includes a gate extension region, power rail connections that include a signal wire connection in contact with the gate extension region and a first interlayer dielectric, wherein the gate extension region extends from the gate to the signal wire connection, and wherein the signal wire connection is electrically isolated from the second backside source/drain contact and the third backside source/drain contact, and signal wire spacers disposed on sides of the signal wire connection, wherein the signal wire spacers are in contact with the first interlayer dielectric, an extended interlayer dielectric, the second backside source/drain contact, and the third backside source/drain contact.

20 Claims, 20 Drawing Sheets

(51) Int. Cl.
*H10D 30/67* (2025.01)
*H10D 62/10* (2025.01)
*H10D 64/01* (2025.01)
*H10D 64/27* (2025.01)
*H10W 10/00* (2026.01)
*H10W 10/17* (2026.01)
*H10W 20/41* (2026.01)

(52) U.S. Cl.
CPC ....... *H10D 30/6757* (2025.01); *H10D 62/121* (2025.01); *H10D 64/01* (2025.01); *H10D 64/017* (2025.01); *H10D 64/518* (2025.01); *H10W 10/014* (2026.01); *H10W 10/17* (2026.01); *H10W 20/427* (2026.01)

(58) Field of Classification Search
CPC .... H10D 64/01; H10D 64/017; H10D 64/518; H10D 30/014; H10W 10/014; H10W 10/17; H10W 20/427; H10W 20/069; H10W 20/20; H10W 20/021; H10W 20/023
See application file for complete search history.

(56) References Cited

U.S. PATENT DOCUMENTS

| | | | | |
|---|---|---|---|---|
| 2021/0134721 | A1 | 5/2021 | Chiang et al. | |
| 2021/0202385 | A1 | 7/2021 | Huang et al. | |
| 2021/0305252 | A1 | 9/2021 | Chiang et al. | |
| 2021/0305381 | A1 | 9/2021 | Chiang et al. | |
| 2021/0351303 | A1 | 11/2021 | Ju et al. | |
| 2021/0376071 | A1 | 12/2021 | Liu et al. | |
| 2021/0376093 | A1 | 12/2021 | Chu et al. | |
| 2022/0068815 | A1 | 3/2022 | Vadi | |
| 2022/0157723 | A1 | 5/2022 | Park et al. | |
| 2023/0040094 | A1 | 2/2023 | Huang et al. | |
| 2023/0063786 | A1 | 3/2023 | Liao et al. | |
| 2023/0067311 | A1 | 3/2023 | Lai et al. | |
| 2023/0106015 | A1* | 4/2023 | Kim .................. | H10D 30/0198<br>257/288 |
| 2025/0194153 | A1 | 6/2025 | Xie et al. | |

* cited by examiner

Y2

Y1

X

X

Y1

Y2

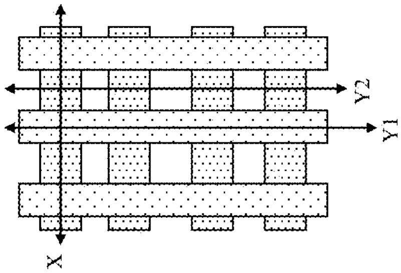
Fig. 3A
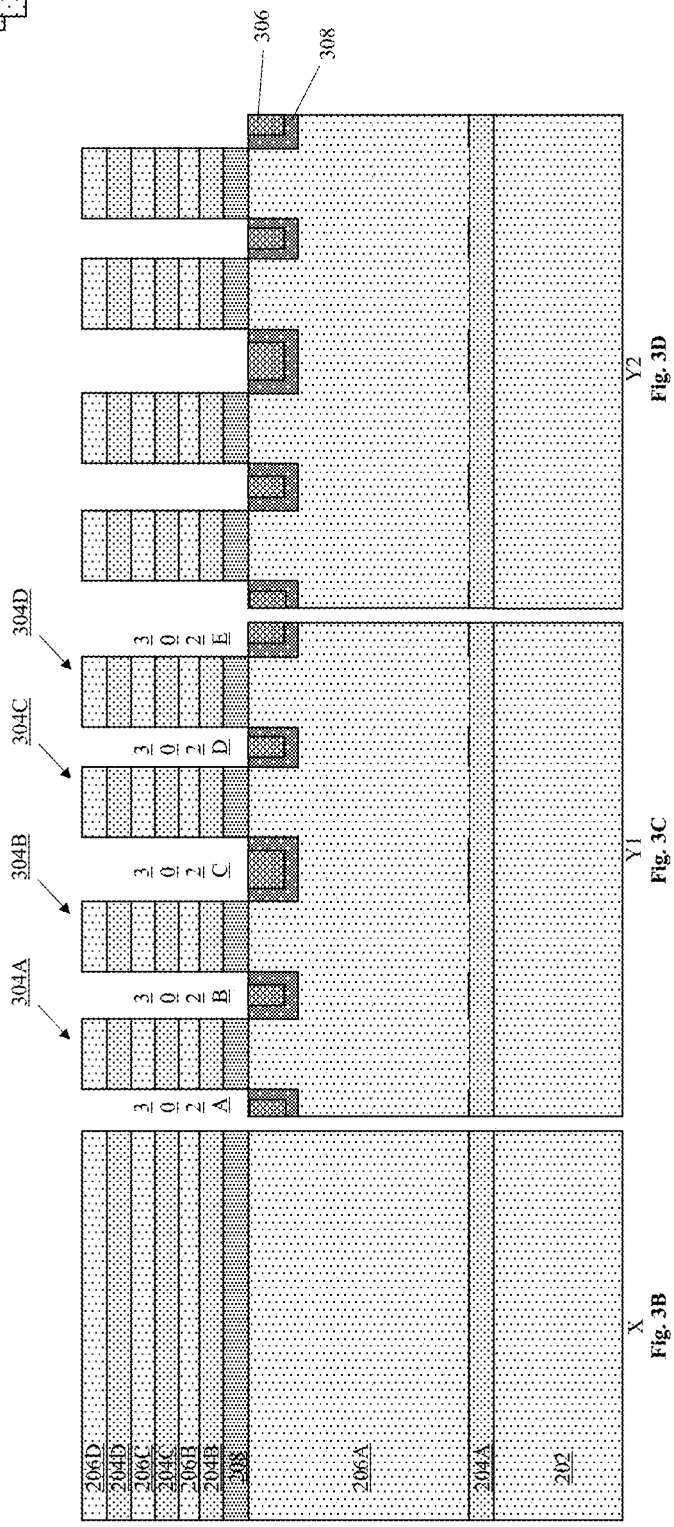
Fig. 3B
Fig. 3C
Fig. 3D

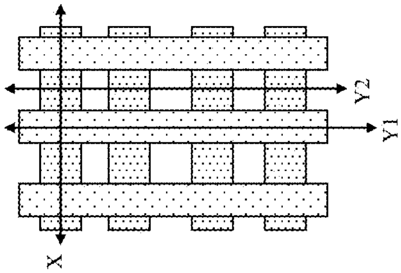
Fig. 4A
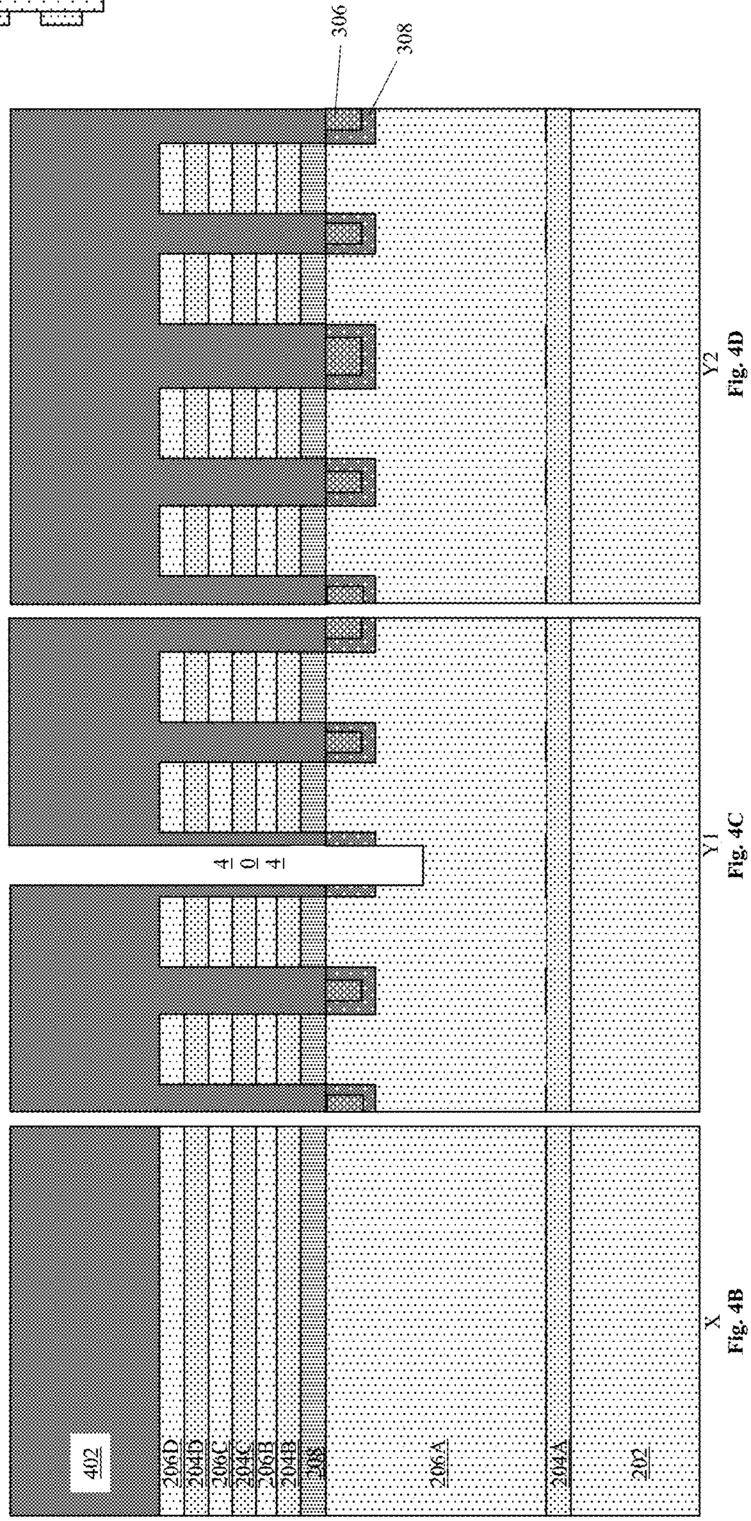
Fig. 4B
Fig. 4C
Fig. 4D

X
Y1
Y2

306
308
602
518B
518C
510B
510C
510D
510E
506B
506C
506D
506E
Y2

606A
606B
604
620
Y1

516A
516B
516C
516D
516E
516F
604
602
508
510B
510A
506A
506B
206D
206C
206B
502
206A
204A
202
X

X
Y2
Y1

306
308
510E
702B
602
510B
506B
Y2

704B
602
604
704A
Y1

708
706
702A
602
508
510 B
506B
510A
506A
206D
206C
206B
502
206A
204A
202
X

X
Y1
Y2

306
308
702B
602
518C
518B
510B
704B
602
604
704A
708
706
702A
602
508
510 B
506B
510A
506A
206D
206C
206B
502
206A
204A
X

Y1

Y2

X
Y2
Y1

306
308
702B
602
518C
518B
510B
506E
506D
506C
506B
704B
602
604
704A
Y2

Y1

708
706
702A
602
508
510B
506B
510A
506A
206D
206C
206B
502
206A
X

X

Y1

Y2

X
Y1
Y2
306
308
1004B
702B
602
518C
518B
704B
604
704A
708
706
702A
508
1002
1004A
206D
206C
206B
502
206A
Y2
Y1
X

X

Y1

Y2

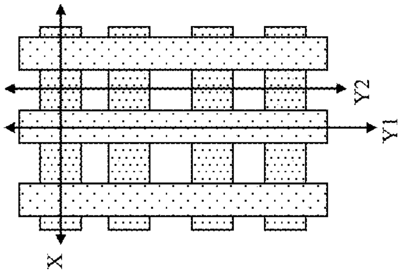
Fig. 12A
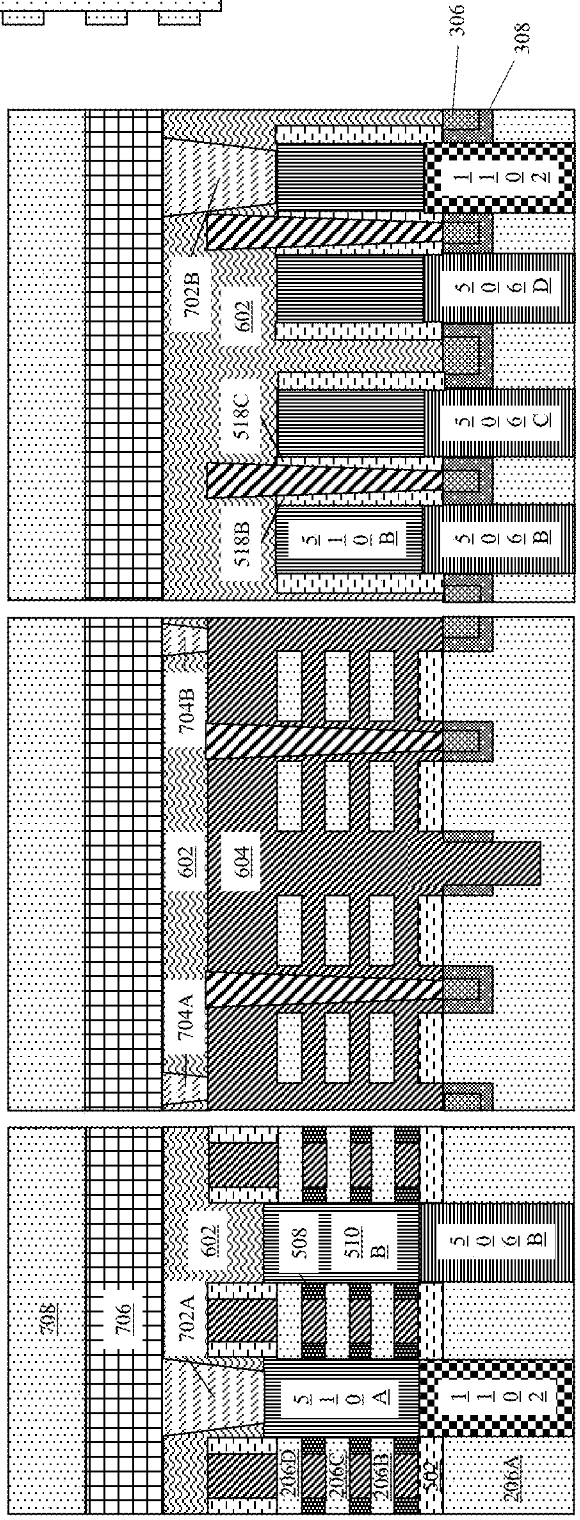
X
Fig. 12B
Y1
Fig. 12C
Y2
Fig. 12D
X
Y1
Y2
306
308
1102
506D
506C
506B
510B
518B
518C
702B
602
Y2
704B
704A
604
Y1
708
706
702A
508
510A
206D
206C
206B
502
206A
X

Y2

Y1

X

Y2

Y1

X

X
Y2
Y1
306
308
1102
702B
602
510D
1402C
518C
510C
1402B
518B
510B
1402A
704B
602
604
704A
708
706
702A
602
508
510B
1402A
510A
1102
206D
206C
206B
502
1302
X
Y1
Y2

X
Y2
Y1

306
308
702B
602
518C
518B
510B
1402A
1402B
1402C
1502
1102
Y2

704B
602
604
704A
620
1502
Y1

708
706
702A
602
508
510B
1402A
510A
1102
206D
206C
206B
502
1302
X

Y2

Y1

X

X
Y1
Y2

306
308
1102
1402C
1702B
702B
602
1502
518C
1402B
1702A
518B
510B
1402A
Y2

704B
602
604
704A
1502
Y1

708
706
702A
602
508
510
B
1402A
510A
1102
206D
206C
206B
502
1302
X

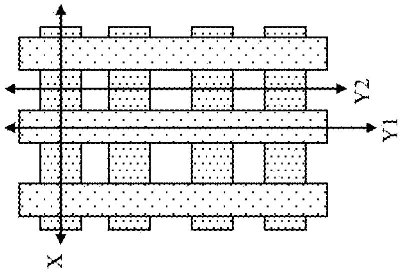
Fig. 18A
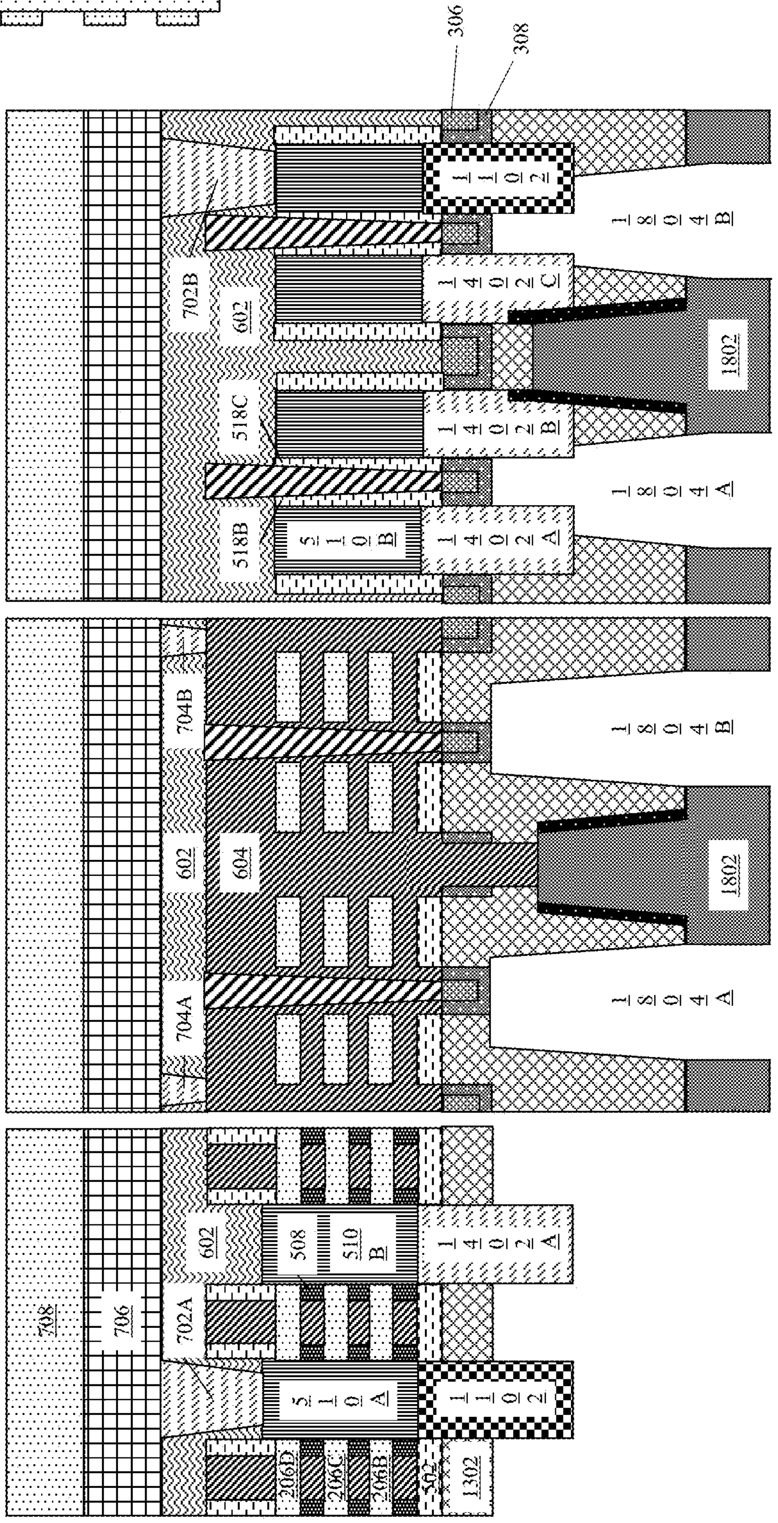
X
Fig. 18B
Y1
Fig. 18C
Y2
Fig. 18D

X

Y1

Y2

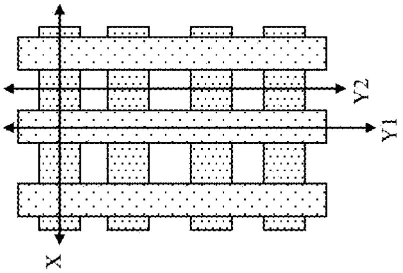
Fig. 20A
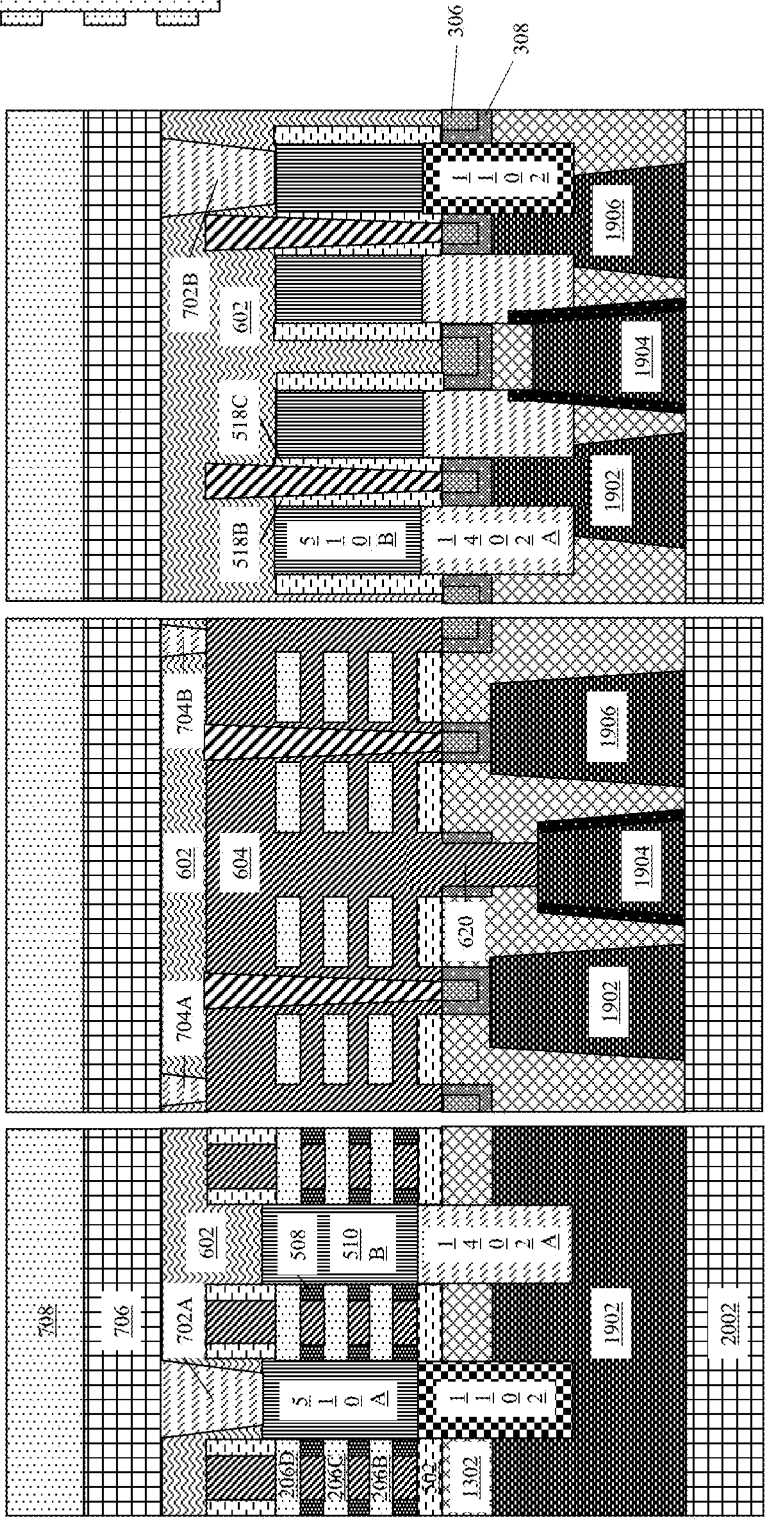
X
Fig. 20B
Y1
Fig. 20C
Y2
Fig. 20D
X
Y1
Y2
306
308
702B
602
518C
518B
510B
1102
1402A
1906
1904
1902
Y2
704B
602
604
704A
620
1906
1904
1902
Y1
708
706
702A
602
508
510B
1402A
510A
1102
206D
206C
206B
502
1302
1902
2002
X

SEMICONDUCTOR STRUCTURE WITH EXTENDED BACKSIDE CONNECTIONS

BACKGROUND

The present disclosure relates to semiconductors, and more specifically, to semiconductors with extended connections at a backside of source/drain regions.

Transistors with smaller physical dimensions generally have faster processing speeds and greater energy efficiency in comparison to transistors with larger physical dimensions. Further, transistors with smaller physical dimensions allow for a greater transistor density in given physical spaces, which allows for increased performance on smaller devices. However, as the physical dimensions of transistors decrease, space allotted to backside power rail connections and backside signal wires connections also decrease. Transistors that do not have strong and stable connections to the power rails and the signal wires may lose functionality or have reduced performance.

SUMMARY

A method is provided according to one embodiment of the present disclosure. The method includes forming a first set of trenches in a semiconductor structure, where forming the first set of trenches further forms a first set of fin structures; depositing outer shallow trench isolation material in the first set of trenches; depositing inner shallow trench isolation material over the outer shallow trench isolation material in the first set of trenches; forming a gate based on the first set of trenches and the first set of fin structures; and forming power rail connections in contact with the gate and the outer shallow trench isolation material, where a signal wire connection of the power rail connections is in contact with a gate extension region of the gate.

A semiconductor structure is provided according to one embodiment of the present disclosure. In one embodiment, the semiconductor structure includes a set of backside source/drain contacts, where the set of backside source/drain contacts include a first backside source/drain contact, a second backside source/drain contact, and a third backside source/drain contact, a gate that includes a gate extension region, power rail connections that include a signal wire connection in contact with the gate extension region and a first interlayer dielectric, where the gate extension region extends from the gate to the signal wire connection, and where the signal wire connection is electrically isolated from the second backside source/drain contact and the third backside source/drain contact, and signal wire spacers disposed on sides of the signal wire connection, where the signal wire spacers are in contact with the first interlayer dielectric, an extended interlayer dielectric, the second backside source/drain contact, and the third backside source/drain contact.

BRIEF DESCRIPTION OF THE DRAWINGS

FIGS. 3A, 3B, 3C, and 3D illustrate a top view and cross-sectional views of a semiconductor structure under fabrication, according to one embodiment.

FIGS. 4A, 4B, 4C, and 4D illustrate a top view and cross-sectional views of a semiconductor structure under fabrication, according to one embodiment.

FIGS. 12A, 12B, 12C, and 12D illustrate a top view and cross-sectional views of a semiconductor structure under fabrication, according to one embodiment.

FIGS. 18A, 18B, 18C, and 18D illustrate a top view and cross-sectional views of a semiconductor structure under fabrication, according to one embodiment.

FIGS. 20A, 20B, 20C, and 20D illustrate a top view and cross-sectional views of a semiconductor structure under fabrication, according to one embodiment.

DETAILED DESCRIPTION

Embodiments of the present disclosure improve upon transistor operations by providing extended backside power rail connections and backside signal wire connections. In one embodiment, a semiconductor structure includes a gate with a gate extension region that provides space for a signal wire connection, such that the signal wire connection can be electrically isolated from other power rail connections on a backside of the semiconductor structure.

One benefit of the disclosed embodiments is to maintain the functionality, and increase the performance, of transistors by providing strong and secure connections between a backside of a transistor, and backside power rails and backside signal wires.

Descriptions of various embodiments of the present disclosure are presented for purposes of illustration, but are not intended to be exhaustive or limited to the embodiments disclosed. Modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Figure 1A:
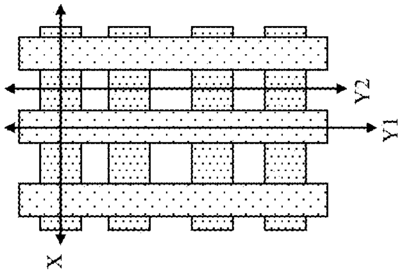
FIGS. 1A, 1B, 1C, and 1D illustrate a top view and cross-sectional views of a semiconductor structure with extended backside connections, according to one embodiment.
Figure 1D:
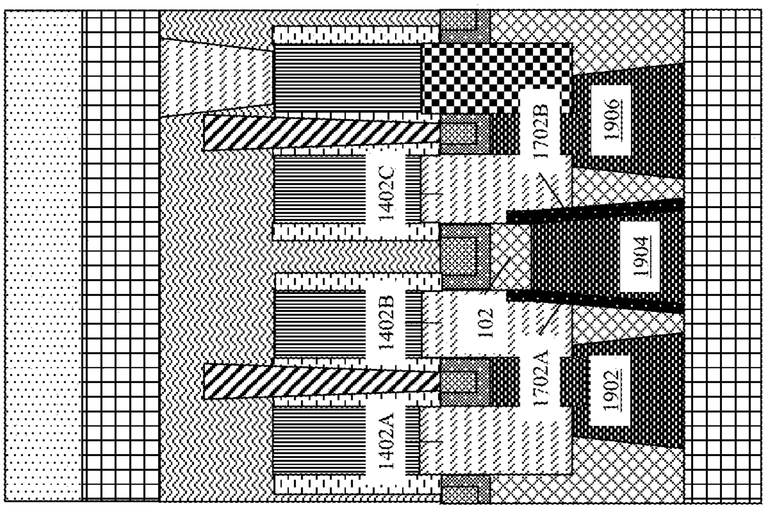
Figure 1C:
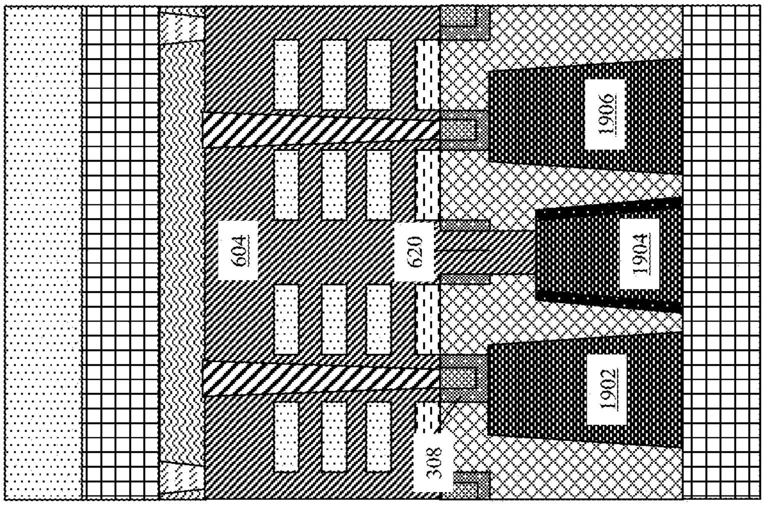
Figure 1B:
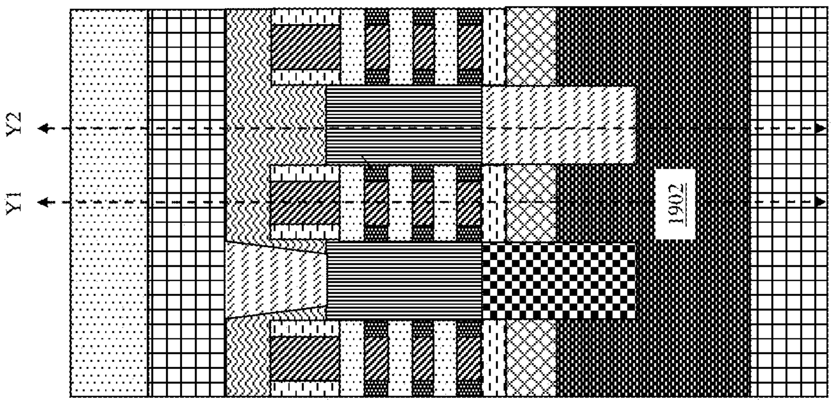

FIGS. 1A, 1B, 1C, and 1D illustrate a top view and cross-sectional views of a semiconductor structure with extended backside connections, according to one embodiment. FIG. 1A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis. FIG. 1B illustrates a cross-section of the semiconductor structure at cross-section indicator X.

FIG. 1C illustrates a cross-section of the semiconductor structure at cross-section indicator Y1. In the illustrated embodiment, a first backside power rail connection (e.g., $V_{DD}$ 1902) and a second backside power rail connection (e.g., Vss 1906) are connected to separate outer shallow trench isolation material 308. Further a signal wire connection 1904 can be connected to a gate extension region 620 of a high-k metal gate material 604. In one embodiment, the gate extension region 620 provides additional spacing on a backside of the semiconductor structure to form a connection between the high-k metal gate material 604 to the signal wire connection 1904.

FIG. 1D illustrates a cross-section of the semiconductor structure at cross-section indicator Y2. In the illustrated embodiment, the first backside power rail connection is connected to a first backside source/drain contact (e.g., backside source/drain contact 1402A) and a second backside source/drain contact (e.g., backside source/drain contact 1402B). The second backside power rail connection can be connected to a third backside source/drain contact (e.g., backside source/drain contact 1402C).

In one embodiment, the signal wire connection 1904 is connected to a first interlayer dielectric (ILD) 102. Further, a first ILD cavity spacer (e.g., ILD cavity spacer 1702A) and a second ILD cavity spacer (e.g., ILD cavity spacer 1702B) can be disposed on opposite sides of the signal wire connection 1904. In one embodiment, the first ILD cavity spacer and the first ILD 102 isolate the signal wire connection 1904 from the second backside contact 1402B. The second ILD cavity spacer and the first ILD 102 can isolate the signal wire connection 1904 from the third backside contact 1402C.

Fabrication processes to form the semiconductor structure of FIGS. 1A-1D are described in FIGS. 2A-20D below.

Figure 2A:
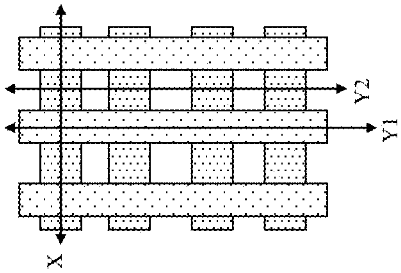
FIGS. 2A, 2B, 2C, and 2D illustrate a top view and cross-sectional views of a semiconductor structure under fabrication, according to one embodiment.
Figure 2B:
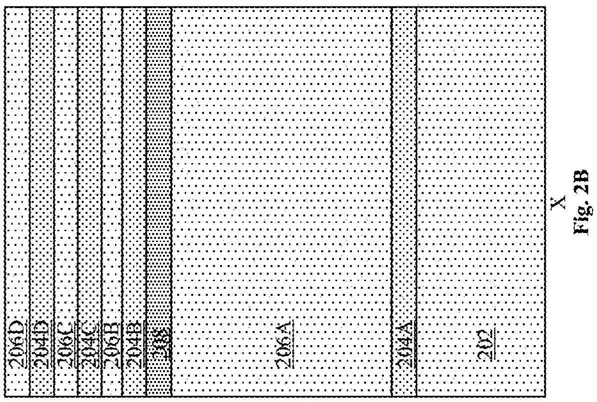
Figure 2C:
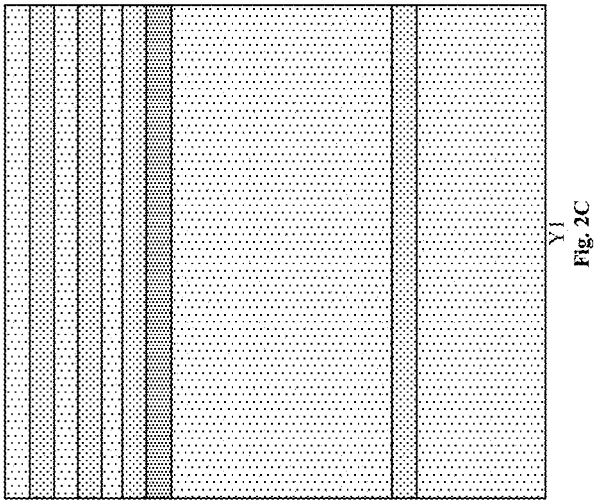
Figure 2D:
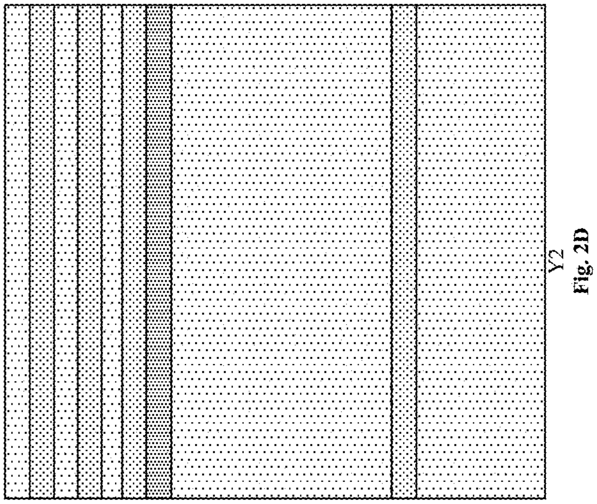

FIGS. 2A, 2B, 2C, and 2D illustrate a top view and cross-sectional views of a semiconductor structure under fabrication, according to one embodiment. FIG. 2A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis. FIG. 2B illustrates a cross-section of the semiconductor structure at cross-section indicator X. FIG. 2C illustrates a cross-section of the semiconductor structure at cross-section indicator Y1. FIG. 2D illustrates a cross-section of the semiconductor structure at cross-section indicator Y2.

In one embodiment, a first layer of the semiconductor structure includes a silicon substrate 202. Additional layers of the semiconductor structure can be grown via epitaxial growth processes.

A second layer (e.g., a sacrificial layer 204A) of the semiconductor structure is grown on the first layer. A third layer (e.g., a silicon layer 206A) can be grown on the second layer. A fourth layer (e.g., silicon etch stop layer 208) can be grown on the third layer. A fifth layer (e.g., a sacrificial layer 204B) can be grown on the fourth layer. A sixth layer (e.g., a nanosheet layer 206B) can be grown on the fifth layer. A seventh layer (e.g., a sacrificial layer 204C) can be grown on the sixth layer. An eighth layer (e.g., a nanosheet layer 206C) can be grown on the seventh layer. A ninth layer (e.g., a sacrificial layer 204D) can be grown on the eighth layer. A tenth layer (e.g., a nanosheet layer 206D) can be grown on the ninth layer.

The sacrificial layers 204A-204D of the semiconductor structure can include materials such as silicon-germanium (SiGe), silicon dioxide ($SiO_2$), silicon nitride ($Si_3N_4$), or the like. In one embodiment, sacrificial layer 204A includes SiGe25%, silicon etch stop layer 208 includes SiGe55%, and sacrificial layer 204B-204D include SiGe with a Ge % ranging from 20% to 35%.

FIGS. 3A, 3B, 3C, and 3D illustrate a top view and cross-sectional views of a semiconductor structure under fabrication, according to one embodiment. FIG. 3A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis. FIG. 3B illustrates a cross-section of the semiconductor structure at cross-section indicator X. FIG. 3C illustrates a cross-section of the semiconductor structure at cross-section indicator Y1. FIG. 3D illustrates a cross-section of the semiconductor structure at cross-section indicator Y2.

In one embodiment, a lithography patterning and an etching process are performed to remove portions of layers 3-10 (e.g., portions of the silicon layer 206A, the nanosheet layer 206B-206D, the sacrificial layer 204B-204D, and silicon etch stop layer 208) of the semiconductor structure, which forms a first set of trenches 302A-302E and fin structures 304A-304D.

An outer shallow trench isolation material 308 (e.g., SiN) can be deposited in the first set of trenches. Afterwards, an inner shallow trench isolation material 306 (e.g., $SiO_2$) can be deposited over the outer shallow trench isolation material 308. In one embodiment, the inner shallow trench isolation material 306 and the outer shallow trench isolation material 308 are planarized and recessed to be level with a topside of the third layer of the semiconductor structure.

FIGS. 4A, 4B, 4C, and 4D illustrate a top view and cross-sectional views of a semiconductor structure under fabrication, according to one embodiment. FIG. 4A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis. FIG. 4B illustrates a cross-section of the semiconductor structure at cross-section indicator X. FIG. 4C illustrates a cross-section of the semiconductor structure at cross-section indicator Y1. FIG. 4D illustrates a cross-section of the semiconductor structure at cross-section indicator Y2.

A frontside organic planarization layer (OPL) 402 can be deposited in remaining spaces of the first set of trenches 302A-302C, and over the fin structures 304A-304D. In one embodiment, an OPL is a coating of organic materials applied to the semiconductor structure to fill gaps, trenches, or irregularities on surfaces of the semiconductor structure. The frontside OPL 402 can be deposited via spin coating, chemical vapor deposition (CVD), or the like. A planarization process may be performed to form level surfaces of the frontside OPL 402 along surfaces of layers 3-10 of the semiconductor structure.

In one embodiment, a lithography patterning and an etching process are performed to form a backside gate connection recess 404. The frontside OPL 402 can extend from a topside of the frontside OPL 402 to the third layer of the semiconductor structure.

Figures 5A, 5B, 5C, 5D:
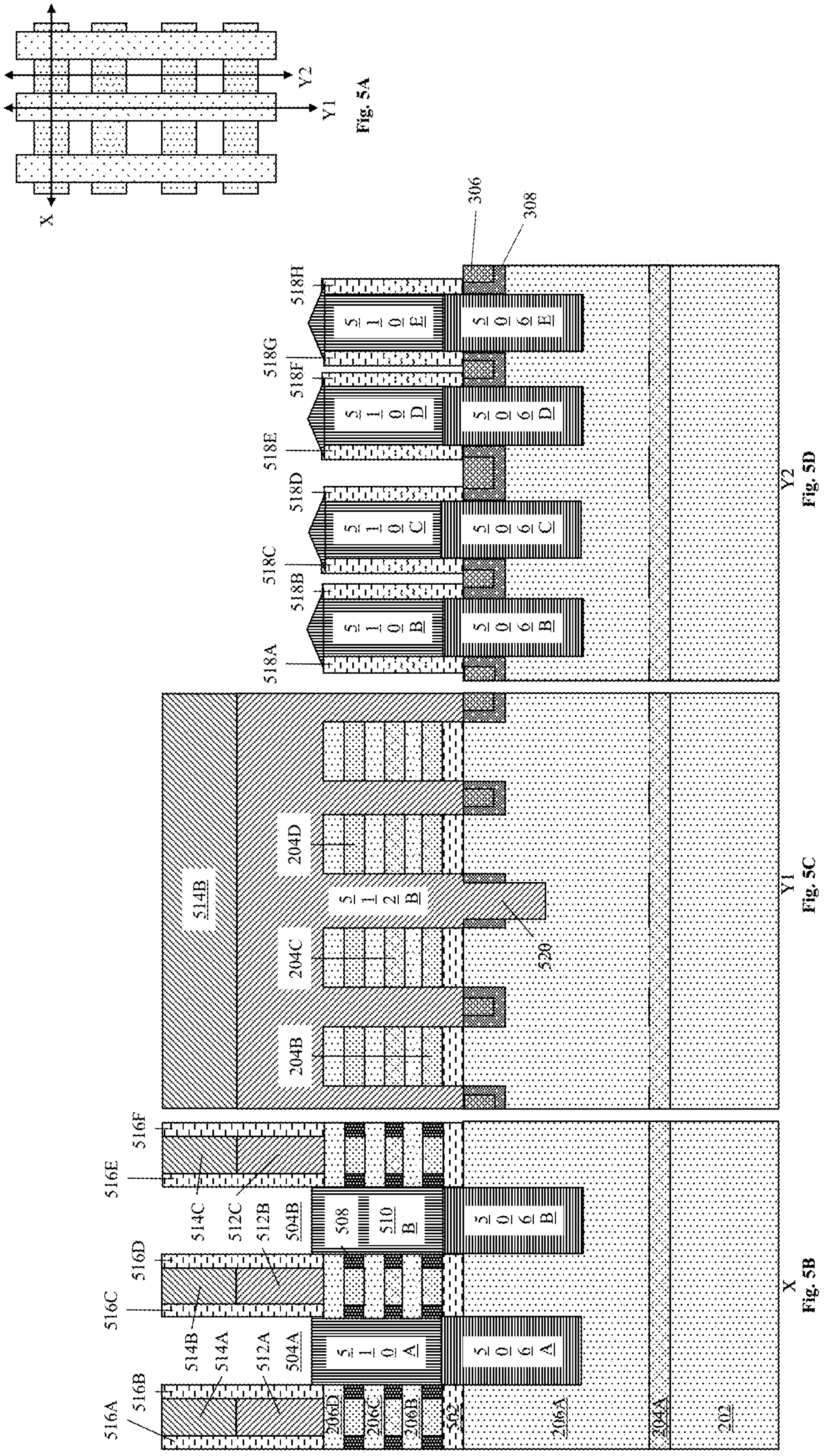
FIGS. 5A, 5B, 5C, and 5D illustrate a top view and cross-sectional views of a semiconductor structure under fabrication, according to one embodiment.

FIGS. 5A, 5B, 5C, and 5D illustrate a top view and cross-sectional views of a semiconductor structure under fabrication, according to one embodiment. FIG. 5A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

FIG. 5B illustrates a cross-section of the semiconductor structure at cross-section indicator X. In the illustrated embodiment, dummy gate material is deposited over layer 10 of the semiconductor structure to form dummy gates 512A-512C, after removal of the frontside OPL 402. The dummy gate material can include a thin layer of $SiO_2$ and polysilicon. A planarization process can be performed to form a level topside of the dummy gates 512A-512C.

Afterwards, hardmasks 514A-514C can be deposited over the dummy gates 512A-512C. In one embodiment, the hardmasks 514A-514C are deposited via chemical or physical vapor deposition process. The hardmasks 514A-514C can include materials such as $Si_3N_4$, amorphous carbon, $SiO_2$ or the like. An etching process can be performed to form sides of the dummy gates 512A-512C, and sides of the hardmasks 515A-514C.

In one embodiment, cavities are formed by removing the silicon etch stop layer 208. Afterwards, sidewall spacers 516A-5164B are disposed on opposing sides of dummy gate 512A and hardmask 514A. Sidewall spacers 516C-5164D are disposed on opposing sides of dummy gate 512B and hardmask 514B. Sidewall spacers 516E-516F are disposed on opposing sides of dummy gate 512C and hardmask 514C. In one embodiment, the spacer material includes dielectrics such as silicon nitride ($Si_3N_4$), silicon dioxide ($SiO_2$), silicon oxynitride ($SiO_xN_y$), or the like. The spacer material can also fill the cavities formed by the removal of the silicon etch stop layer 208, thereby forming a self-aligned gate isolation (SASI) layer 502.

An etching process can be performed to form a second set of trenches 504A-504B that extend from a topside of adjacent spacers (e.g., sidewall spacers 516B-516C for trench 504A, and sidewall spacers 516D-516E for trench 504B), through layers 4-10 of the semiconductor structure, and through a portion of layer 3 of the semiconductor structure. Afterwards, an etching process can be used to etch the SASI layer 502 into the silicon layer 206A.

In one embodiment, placeholders 506A-506B can be epitaxially grown and formed over the layer 3 (e.g., silicon layer 206A) of the semiconductor structure in the second set of trenches 504A-504B. In one embodiment, the placeholders 506A-506B include non-doped or intrinsic SiGe. Further, source/drain regions 510A-510B can then be epitaxially grown and formed over the placeholders 506A-506B. In one embodiment, the source/drain regions 510A-510B include doped silicon, doped SiGe, or the like.

FIG. 5C illustrates a cross-section of the semiconductor structure at cross-section indicator Y1. In the illustrated embodiment, dummy gate 512B is disposed on the inner shallow trench isolation material 306, the outer shallow trench isolation material 308, and the fin structures 304A-304D. Further, the dummy gate material can fill the backside gate connection recess 404, and form a dummy gate extension region 520. Hardmask 514B is disposed on the dummy gate 512B.

FIG. 5D illustrates a cross-section of the semiconductor structure at cross-section indicator Y2. In the illustrated embodiment, when the spacer material is deposited at the sides of the dummy gates 512A-512C (as discussed in FIG. 5B), spacer material can also be deposited over the nanosheets formed from nanosheet layers 206B-206D to form source/drain spacers 518A-518F. Source/drain spacers 518A-518B are disposed on opposing sides of source/drain region 510B. Source/drain spacers 518C-518D are disposed on opposing sides of source/drain region 510C. In one embodiment, source/drain regions 510B-510C are source/drain regions of NFETs.

Source/drain spacers 518E-518F are disposed on opposing sides of source/drain region 510D. Source/drain spacers 518G-518H are disposed on opposing sides of source/drain region 510E. In one embodiment, source/drain regions 510D-510E are source/drain regions of PFETs.

Figure 6A:
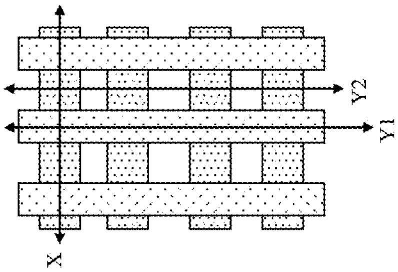
FIGS. 6A, 6B, 6C, and 6D illustrate a top view and cross-sectional views of a semiconductor structure under fabrication, according to one embodiment.

FIGS. 6A, 6B, 6C, and 6D illustrate a top view and cross-sectional views of a semiconductor structure under fabrication, according to one embodiment. FIG. 6A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

Figure 6D:
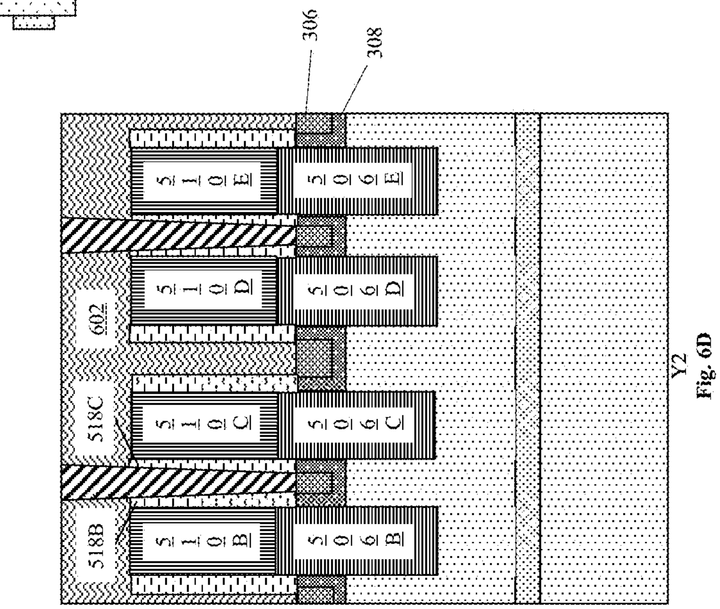
Figure 6C:
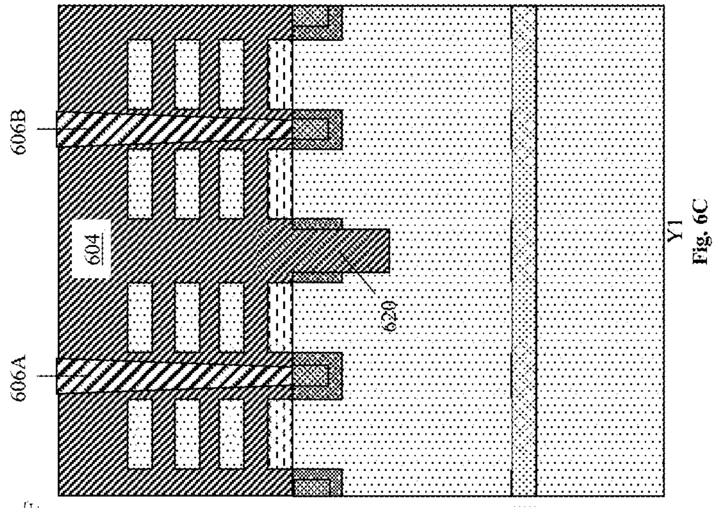
Figure 6B:
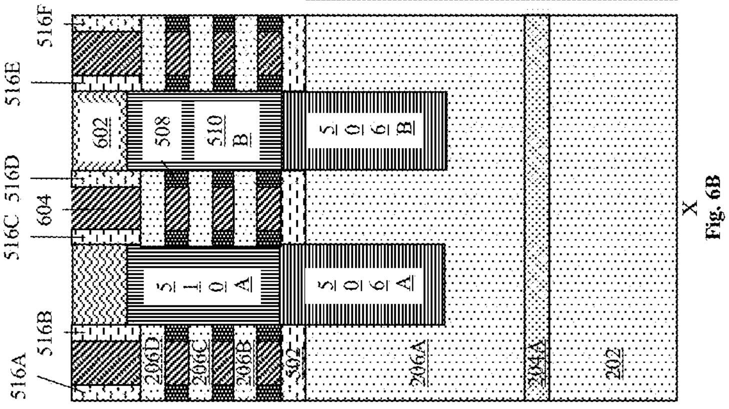

FIG. 6B illustrates a cross-section of the semiconductor structure at cross-section indicator X. In the illustrated embodiment, a second ILD 602 is deposited over the source/drain regions 510A-510B between opposing spacers (e.g., between sidewall spacers 516B-516C, and between sidewall spacers 516D-516E). In one embodiment, the second ILD 602 includes $SiO_2$, low-k dielectrics (e.g., silicon dioxide ($SiO_2$), carbon-doped oxides, or the like), organic polymer dielectrics, or the like.

Etching processes can be performed to remove the dummy gates 512A-512C, the hardmasks 514A-514C, and layers 5, 7, and 9 (e.g., the sacrificial layers 204B-204D) of the semiconductor structure. Further, high-k metal gates can be formed, as described in FIG. 6C herein. Afterwards, a planarization process can be performed to level a topside of the sidewall spacers 516A-516F, the high-k metal gate material 604, and the second ILD 602.

FIG. 6C illustrates a cross-section of the semiconductor structure at cross-section indicator Y1. In the illustrated embodiment, nanosheets are formed as a result of the removal of portions of layers 5, 7, and 9 (e.g., the sacrificial layers 204B-204D) of the semiconductor structure. Further, the high-k metal gate material 604 is deposited over the layers 3-4, 6, 8, and 10 (e.g., SASI 502, silicon layer 206A, and nanosheet layers 206B-206D) of the semiconductor structure, the inner shallow trench isolation material 306, and the outer shallow trench isolation material 308. In this manner, the high-k metal gate material 604 is further deposited into the space created by the removal of the dummy gate extension region 520 to form the gate extension region 620.

Additional hardmasks (not shown) can be added to aid in forming gate cuts 606A-606B. In one embodiment, an etching process forms the gate cuts 606A-606B from a top surface of the high-k metal gate material 604 (post-planarization) to a topside of the inner shallow trench isolation material 306. The gate cuts 606A-606B can be filled with a dielectric material to separate the high-k metal gate material 604 into separate metal gate formations.

FIG. 6D illustrates a cross-section of the semiconductor structure at cross-section indicator Y2. As previously discussed, source/drain spacer 518B is disposed on a face of source/drain region 510B. Source/drain spacer 518C is disposed on a face of source/drain region 510C. Source/drain spacer 518F is disposed on a face of source/drain region 510D. Source/drain spacer 518G is disposed on a face of source/drain region 510E. In the illustrated embodiment, gate cut 606A is formed between spacers 518B-518C, and gate cut 606B is formed between spacers 518F-518G.

Figures 7A, 7B, 7C, 7D:
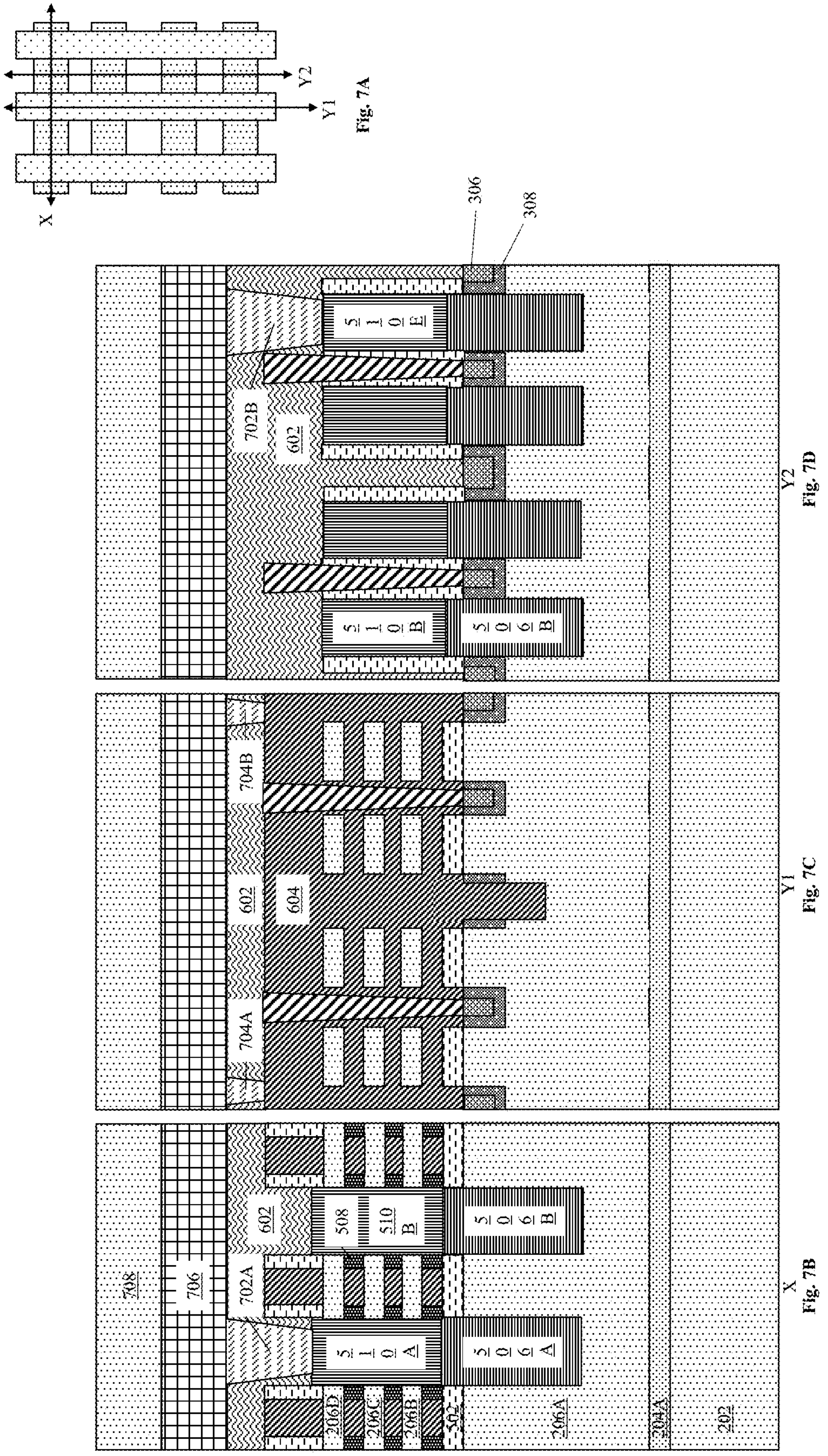
FIGS. 7A, 7B, 7C, and 7D illustrate a top view and cross-sectional views of a semiconductor structure under fabrication, according to one embodiment.

FIGS. 7A, 7B, 7C, and 7D illustrate a top view and cross-sectional views of a semiconductor structure under fabrication, according to one embodiment. FIG. 7A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

FIG. 7B illustrates a cross-section of the semiconductor structure at cross-section indicator X. In the illustrated embodiment, a first source/drain contact (e.g., source/drain contact 702A) is disposed on a frontside of the source/drain region 510A. In one embodiment, the source/drain contact 702A includes a silicide liner (e.g., Ti, Ni, NiPt, etc.), an adhesion metal line (e.g., TiN, TaN, etc.), low resistance metal fill (e.g., W, Co, Ru, etc.), or the like. Other contacts can be added to the semiconductor structure as described in FIGS. 7C-7D herein. Afterwards, a back-end-of-line (BEOL) interconnect can be disposed on the contacts and the second ILD 602 to connect the semiconductor structure to an integrated circuit. Further, a carrier wafer bonding process can be performed to connect the BEOL interconnect to a carrier wafer 708.

FIG. 7C illustrates a cross-section of the semiconductor structure at cross-section indicator Y1. In the illustrated embodiment, gate contacts 704A-704B are disposed on the separate metal gate formations. Further, the BEOL interconnect 706 is shown as being disposed on gate contacts 704A-704B and the second ILD 602. The carrier wafer 708 is shown as being disposed on the BEOL interconnect 706.

FIG. 7D illustrates a cross-section of the semiconductor structure at cross-section indicator Y2. In the illustrated embodiment, a second source/drain contact (e.g., source/drain contact 702B) is disposed on a source/drain region (e.g., source/drain region 510E). Further, the BEOL interconnect 706 is shown as being disposed on source/drain contact 702B and the second ILD 602. The carrier wafer 708 is shown as being disposed on the BEOL interconnect 706.

Figures 8A, 8B, 8C, 8D:
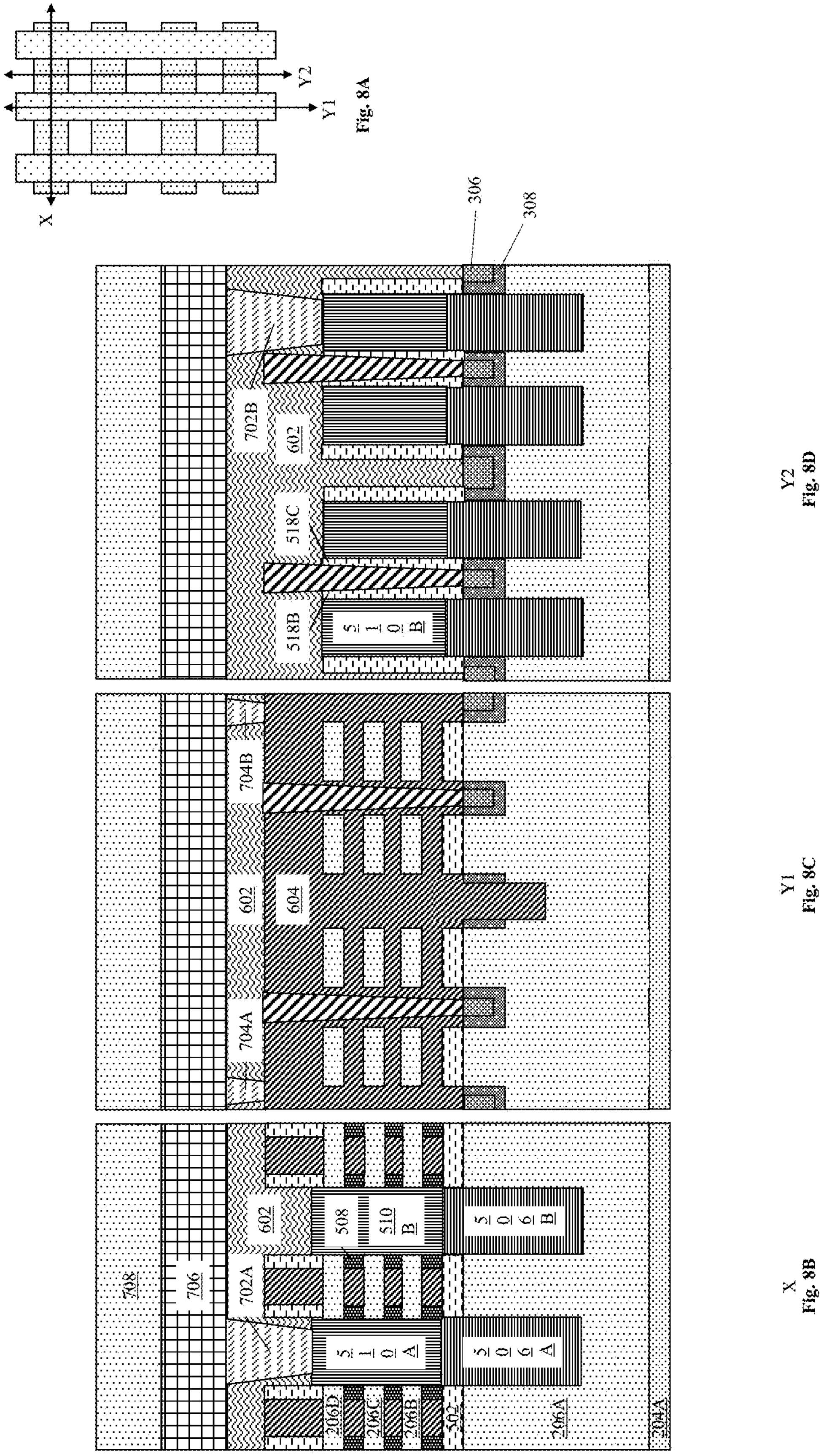
FIGS. 8A, 8B, 8C, and 8D illustrate a top view and cross-sectional views of a semiconductor structure under fabrication, according to one embodiment.

FIGS. 8A, 8B, 8C, and 8D illustrate a top view and cross-sectional views of a semiconductor structure under fabrication, according to one embodiment. FIG. 8A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

FIG. 8B illustrates a cross-section of the semiconductor structure at cross-section indicator X. FIG. 8C illustrates a cross-section of the semiconductor structure at cross-section indicator Y1. FIG. 8D illustrates a cross-section of the semiconductor structure at cross-section indicator Y2.

In one embodiment, the semiconductor structure is flipped to provide access to further process the silicon substrate 202. However, for consistency in the illustrations, the illustrated embodiment retains the orientation of the semiconductor structure from the preceding figures. In one embodiment, layer 1 (e.g., the silicon substrate 202) of the semiconductor structure is removed, which exposes layer 2 (e.g., sacrificial layer 204A) of the semiconductor structure.

Figure 9A:
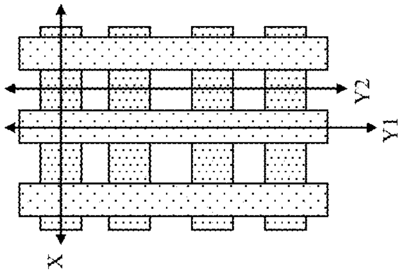
FIGS. 9A, 9B, 9C, and 9D illustrate a top view and cross-sectional views of a semiconductor structure under fabrication, according to one embodiment.

FIGS. 9A, 9B, 9C, and 9D illustrate a top view and cross-sectional views of a semiconductor structure under fabrication, according to one embodiment. FIG. 9A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

Figure 9D:
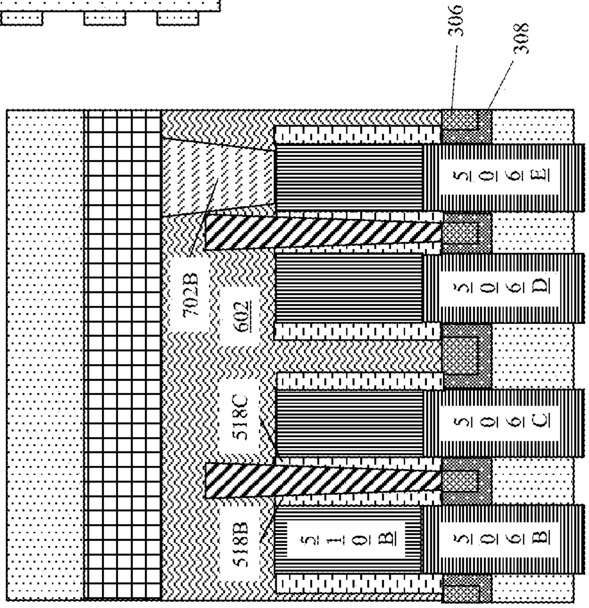
Figure 9C:
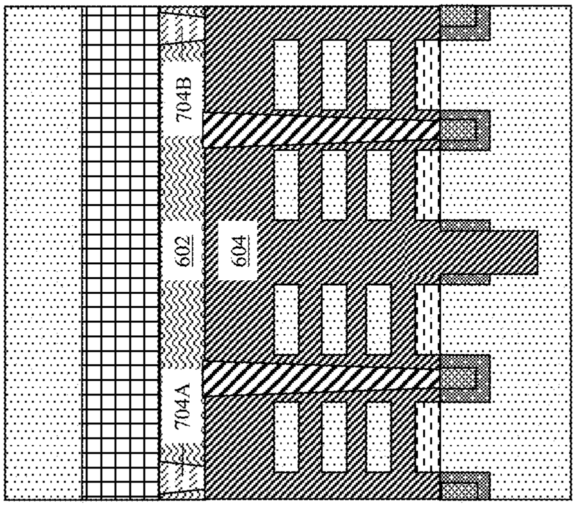
Figure 9B:
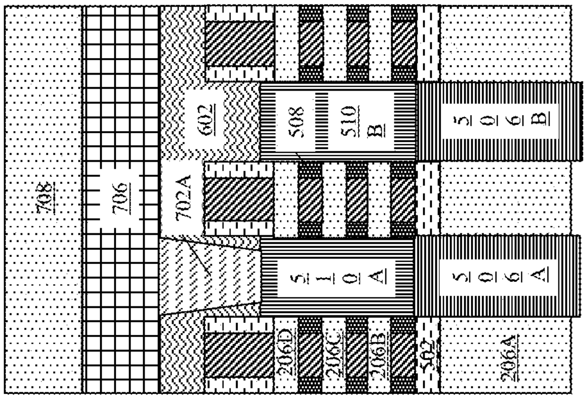

FIG. 9B illustrates a cross-section of the semiconductor structure at cross-section indicator X. FIG. 9C illustrates a cross-section of the semiconductor structure at cross-section indicator Y1. FIG. 9D illustrates a cross-section of the semiconductor structure at cross-section indicator Y2.

In one embodiment, an etching process is performed to remove layer 2 (e.g., sacrificial layer 204A) of the semiconductor structure. Further, an etching process can be performed to recess layer 3 (e.g., silicon layer 206A), and expose the placeholders 506A-506E. The material compositions of the placeholders 506A-506E prevent the placeholders 506A-506E from being etched.

Figure 10A:
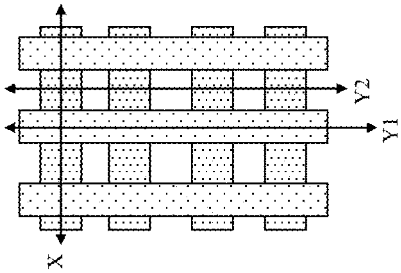
FIGS. 10A, 10B, 10C, and 10D illustrate a top view and cross-sectional views of a semiconductor structure under fabrication, according to one embodiment.

FIGS. 10A, 10B, 10C, and 10D illustrate a top view and cross-sectional views of a semiconductor structure under fabrication, according to one embodiment. FIG. 10A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

Figure 10B:
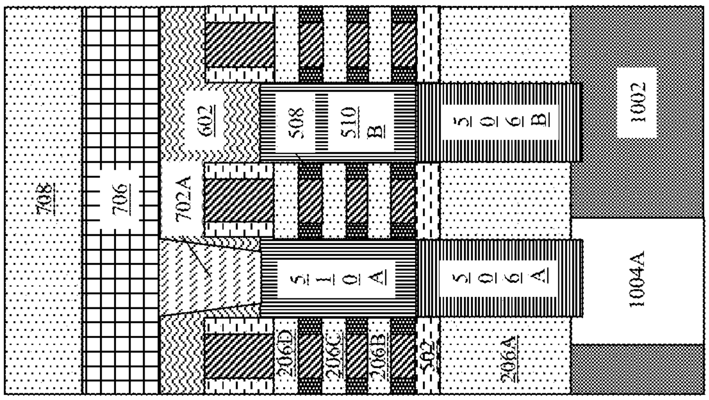
Figure 10C:
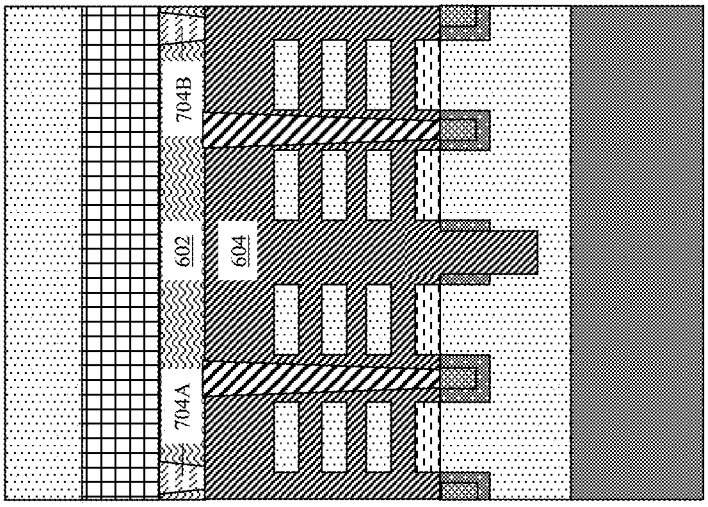
Figure 10D:
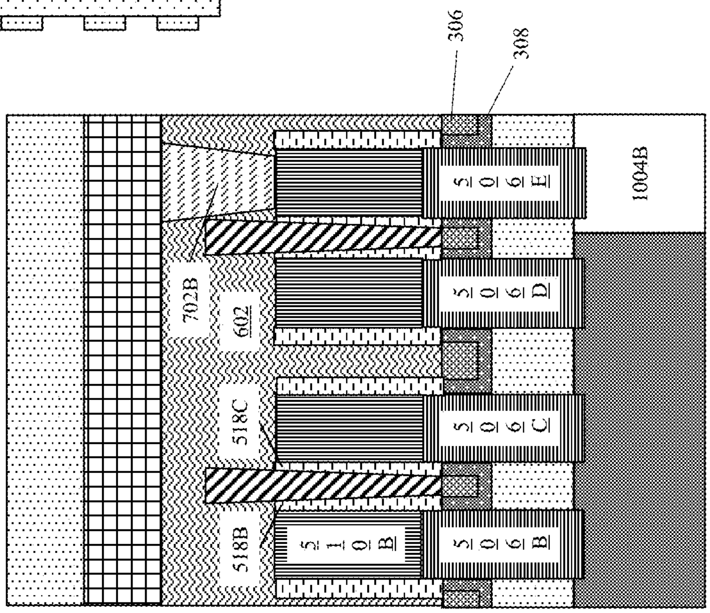

FIG. 10B illustrates a cross-section of the semiconductor structure at cross-section indicator X. FIG. 10C illustrates a cross-section of the semiconductor structure at cross-section indicator Y1. FIG. 10D illustrates a cross-section of the semiconductor structure at cross-section indicator Y2.

A first backside OPL 1002 can be deposited on a backside of layer 2 (e.g., the silicon layer 206A) of the semiconductor structure. In one embodiment, the first backside OPL 1002 covers the backside of the placeholders 506A-506E. Afterwards, an etching process can be performed to form a first set of backside recesses 1004A-1004B in the first backside OPL 1002, which allows for a selective removal of the placeholders 506A and 506E.

Figures 11A, 11B, 11C, 11D:
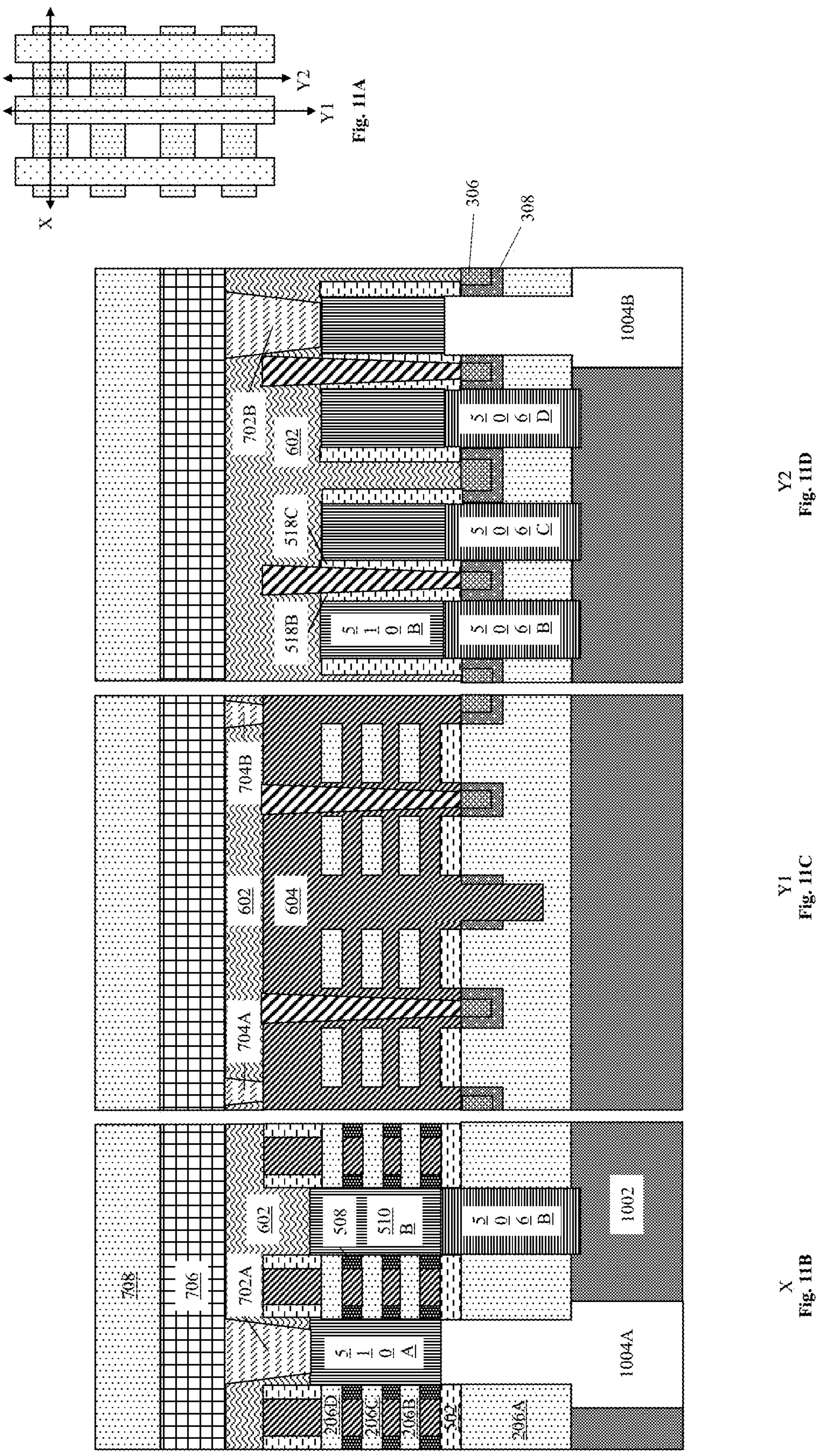
FIGS. 11A, 11B, 11C, and 11D illustrate a top view and cross-sectional views of a semiconductor structure with extended backside connections, according to one embodiment.

FIGS. 11A, 11B, 11C, and 11D illustrate a top view and cross-sectional views of a semiconductor structure with extended backside connections, according to one embodiment. FIG. 11A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

FIG. 11B illustrates a cross-section of the semiconductor structure at cross-section indicator X. FIG. 11C illustrates a cross-section of the semiconductor structure at cross-section indicator Y1. FIG. 11D illustrates a cross-section of the semiconductor structure at cross-section indicator Y2.

In one embodiment, placeholders 506B, 506C, and 506D that are not intended to form backside contacts connections are not removed, since they are protected by the first backside OPL 1002. However, the exposed placeholders (e.g., placeholder 506A and placeholder 506E) can be removed via an etching process, which extends the first set of backside recesses 1004A-1004B in the first backside OPL 1002.

FIGS. 12A, 12B, 12C, and 12D illustrate a top view and cross-sectional views of a semiconductor structure under fabrication, according to one embodiment. FIG. 12A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

FIG. 12B illustrates a cross-section of the semiconductor structure at cross-section indicator X. FIG. 12C illustrates a cross-section of the semiconductor structure at cross-section indicator Y1. FIG. 12D illustrates a cross-section of the semiconductor structure at cross-section indicator Y2.

In one embodiment, a dielectric fill material 1102 is deposited to fill the spaces formed by removing placeholder 508A and placeholder 508E, after removal of the first backside OPL 1002. The dielectric fill material 1102 can include silicon nitride (e.g., SiN). Afterwards, a backside of the semiconductor structure can be planarized to form a level surface between the dielectric fill material, the placeholders 506B-506D, and layer 2 (e.g., silicon layer 206A).

Figure 13A:
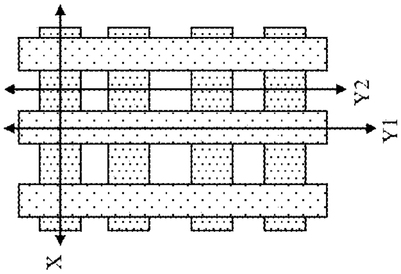
FIGS. 13A, 13B, 13C, and 13D illustrate a top view and cross-sectional views of a semiconductor structure under fabrication, according to one embodiment.

FIGS. 13A, 13B, 13C, and 13D illustrate a top view and cross-sectional views of a semiconductor structure under fabrication, according to one embodiment. FIG. 13A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

Figure 13D:
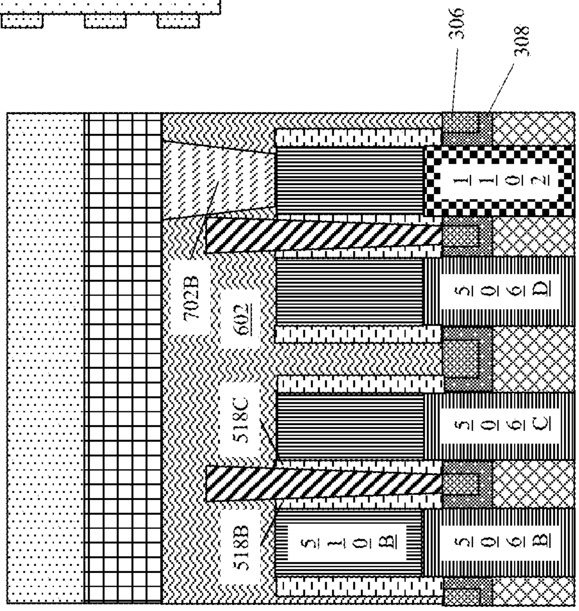
Figure 13C:
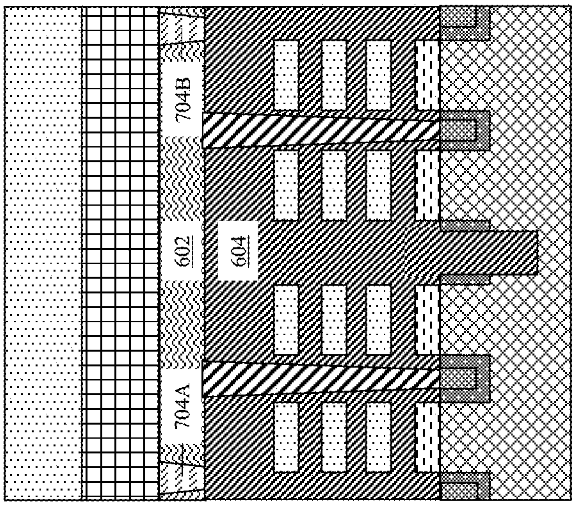
Figure 13B:
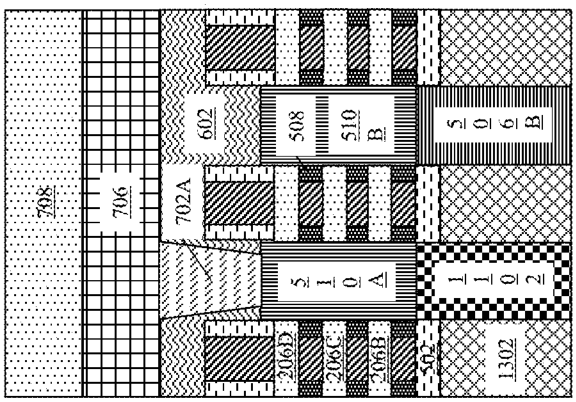

FIG. 13B illustrates a cross-section of the semiconductor structure at cross-section indicator X. FIG. 13C illustrates a cross-section of the semiconductor structure at cross-section indicator Y1. FIG. 13D illustrates a cross-section of the semiconductor structure at cross-section indicator Y2.

In one embodiment, an etching process is performed to remove layer 2 (e.g., silicon layer 206A) of the semiconductor structure. A third ILD 1302 can then be deposited to fill the space remaining from the removal of layer 2. Afterwards, a planarization process can be performed on the third ILD 1302 to form a level surface with the dielectric fill material 1102 and the placeholders 506B-506D.

Figure 14A:
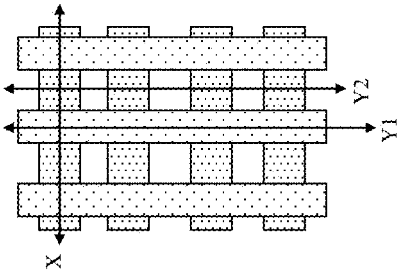
FIGS. 14A, 14B, 14C, and 14D illustrate a top view and cross-sectional views of a semiconductor structure under fabrication, according to one embodiment.

FIGS. 14A, 14B, 14C, and 14D illustrate a top view and cross-sectional views of a semiconductor structure under fabrication, according to one embodiment. FIG. 14A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

Figure 14D:
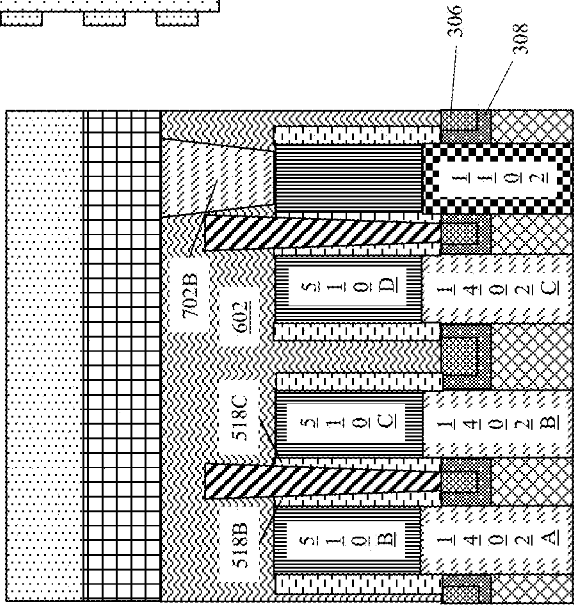
Figure 14C:
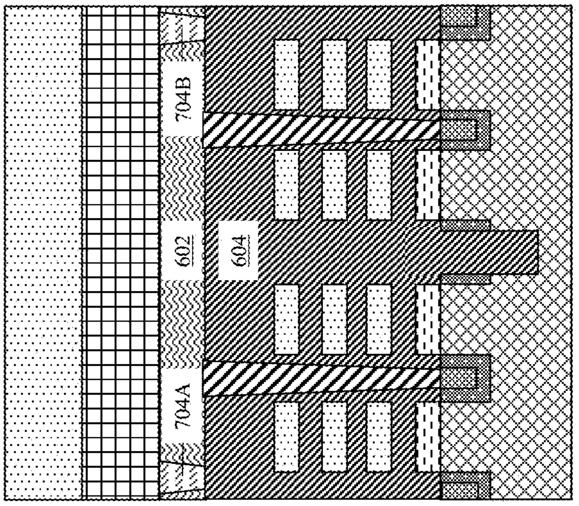
Figure 14B:
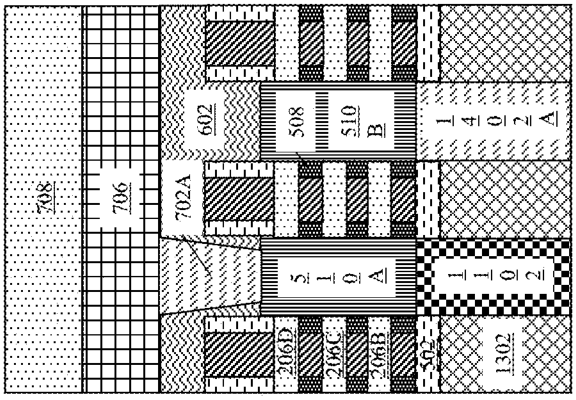

FIG. 14B illustrates a cross-section of the semiconductor structure at cross-section indicator X. FIG. 14C illustrates a cross-section of the semiconductor structure at cross-section indicator Y1. FIG. 14D illustrates a cross-section of the semiconductor structure at cross-section indicator Y2.

In one embodiment, an etching process is performed to remove placeholders 506B-506D. Backside source/drain contact 1402A can be connected to source/drain region 510B via the space formed by the removal of placeholder 506B. Backside source/drain contact 1402B can be connected to source/drain region 510C via the space formed by the removal of placeholder 506B. Backside source/drain contact 1402C can be connected to source/drain region 510D via the space formed by the removal of placeholder 506D.

Figures 15A, 15B, 15C, 15D:
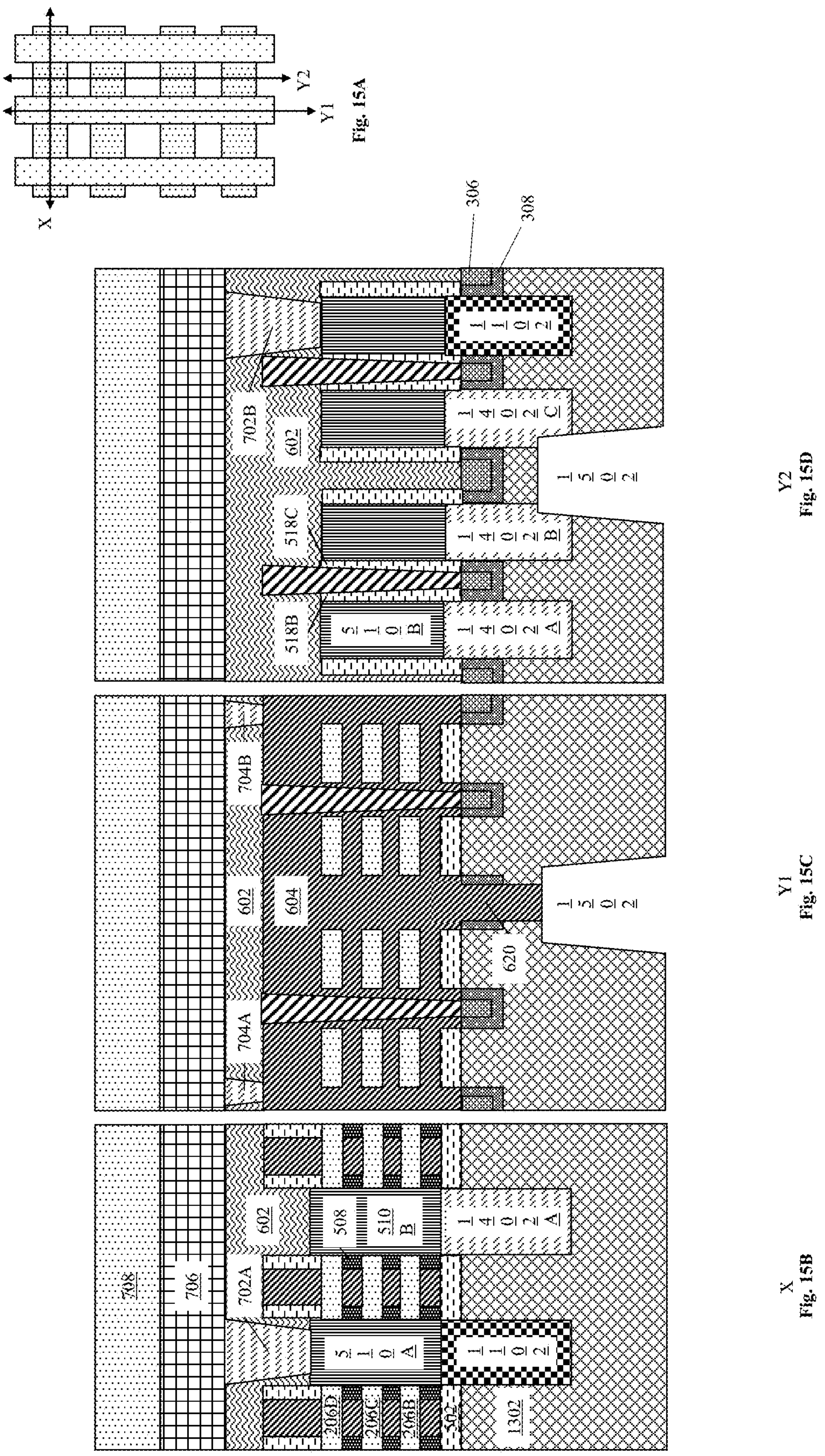
FIGS. 15A, 15B, 15C, and 15D illustrate a top view and cross-sectional views of a semiconductor structure under fabrication, according to one embodiment.

FIGS. 15A, 15B, 15C, and 15D illustrate a top view and cross-sectional views of a semiconductor structure under fabrication, according to one embodiment. FIG. 15A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

FIG. 15B illustrates a cross-section of the semiconductor structure at cross-section indicator X. In the illustrated embodiment, additional ILD material is deposited to extend the third ILD 1302.

FIG. 15C illustrates a cross-section of the semiconductor structure at cross-section indicator Y1. In the illustrated embodiment, an etching process can be performed to form an ILD cavity 1502. The ILD cavity 1502 can extend from the gate extension region 620 to a bottomside of the third ILD 1302.

FIG. 15D illustrates a cross-section of the semiconductor structure at cross-section indicator Y2. In the illustrated embodiment, the ILD cavity 1502 extends from the first ILD 102 to a bottomside of the third ILD 1302. Further, the ILD cavity 1502 can share a surface with backside source/drain contact 1402B and backside source/drain contact 1402C.

Figure 16A:
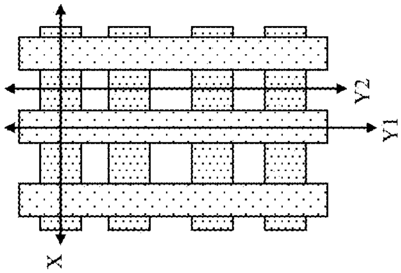
FIGS. 16A, 16B, 16C, and 16D illustrate a top view and cross-sectional views of a semiconductor structure under fabrication, according to one embodiment.

FIGS. 16A, 16B, 16C, and 16D illustrate a top view and cross-sectional views of a semiconductor structure under fabrication, according to one embodiment. FIG. 16A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

Figure 16D:
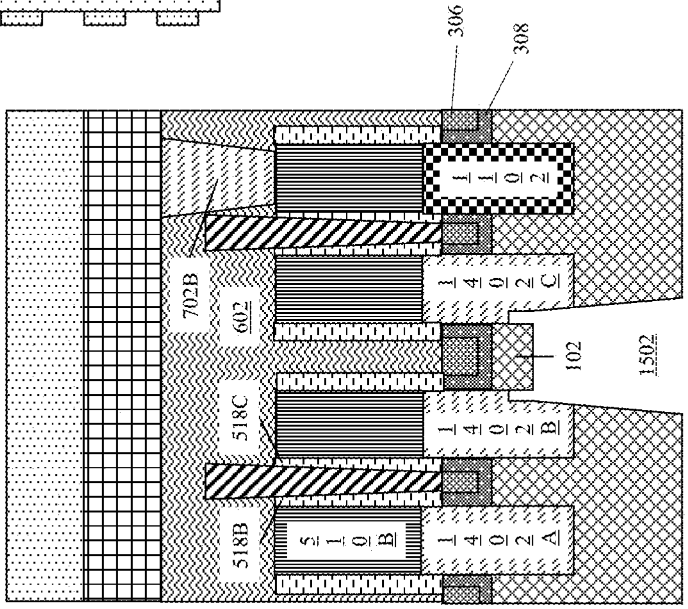
Figure 16C:
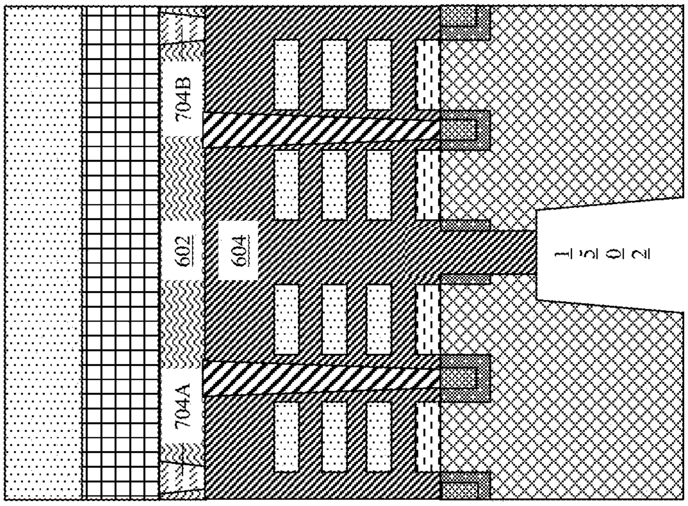
Figure 16B:
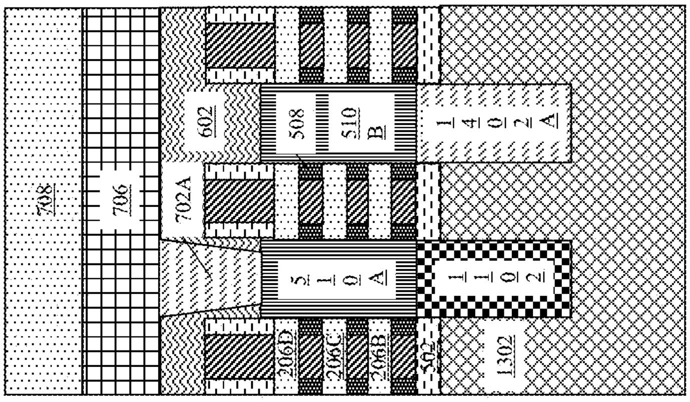

FIG. 16B illustrates a cross-section of the semiconductor structure at cross-section indicator X. FIG. 16C illustrates a cross-section of the semiconductor structure at cross-section indicator Y1.

FIG. 16D illustrates a cross-section of the semiconductor structure at cross-section indicator Y2. In the illustrated embodiment, an etching process is performed to etch the backside contact metal to extend the ILD cavity 1502 along a shared face between backside source/drain contact 1402B and the first ILD 102, and along a shared face between backside source/drain contact 1402C and the first ILD 102.

Figures 17A, 17B, 17C, 17D:
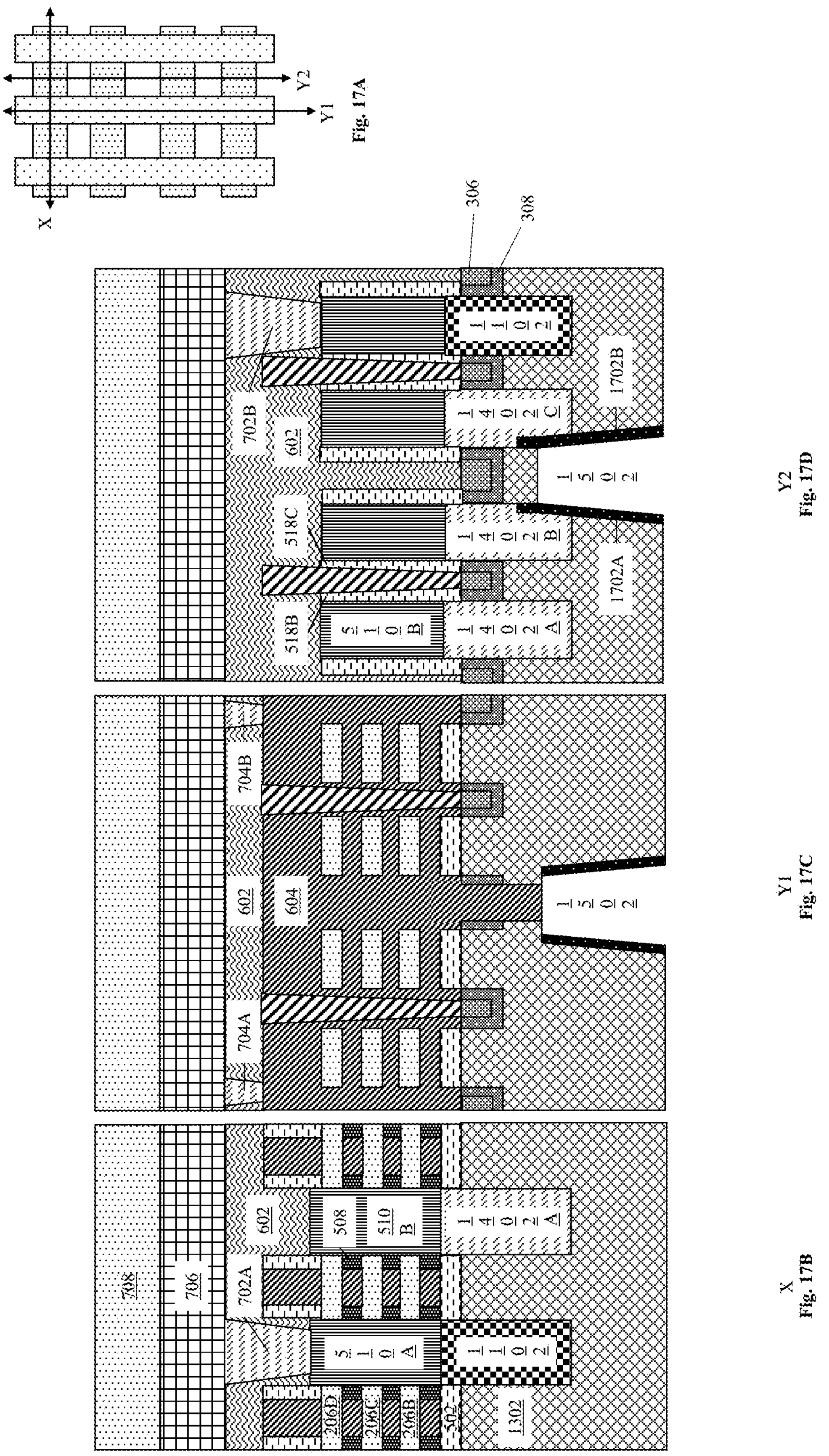
FIGS. 17A, 17B, 17C, and 17D illustrate a top view and cross-sectional views of a semiconductor structure under fabrication, according to one embodiment.

FIGS. 17A, 17B, 17C, and 17D illustrate a top view and cross-sectional views of a semiconductor structure under fabrication, according to one embodiment. FIG. 17A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

FIG. 17B illustrates a cross-section of the semiconductor structure at cross-section indicator X. FIG. 17C illustrates a cross-section of the semiconductor structure at cross-section indicator Y1. FIG. 17D illustrates a cross-section of the semiconductor structure at cross-section indicator Y2.

In one embodiment, ILD cavity spacers 1702A-1702B are disposed on the sides of the ILD cavity 1502. ILD cavity spacer 1702A can be disposed along a side in contact with the third ILD 1302, backside source/drain contact 1402B and the first ILD. ILD cavity spacer 1702B can be disposed along a side in contact with the first ILD 102, backside source/drain contact 1402C, and the first ILD 102. In this manner, the ILD cavity spacers 1702A-1702B prevent shorts from forming between the signal wire connection 1904 and the backside source/drain contacts 1402B-1402C.

FIGS. 18A, 18B, 18C, and 18D illustrate a top view and cross-sectional views of a semiconductor structure under fabrication, according to one embodiment. FIG. 18A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

FIG. 18B illustrates a cross-section of the semiconductor structure at cross-section indicator X. In the illustrated embodiment, an etching process is performed to recess the third ILD 1302. As a result, portions of the dielectric fill material 1102 and the backside source/drain contact 1402A are exposed.

FIG. 18C illustrates a cross-section of the semiconductor structure at cross-section indicator Y1. In the illustrated embodiment, a second backside OPL 1802 is deposited onto a bottomside of the third ILD 1302. The second backside OPL 1802 can fill the ILD cavity 1502. Afterwards, an etching process can be performed to form a second set of backside recesses 1804A-1804B. The second set of backside recesses 1804A-1804B are spaced apart from the ILD cavity spacers 1702A-1702B, such that contacts formed through the second set of backside recesses 1804A-1804B do not form a short with a contact formed in the portion of the second backside OPL 1802 that filled the ILD cavity 1502. The second set of backside recesses 1804A-1804B can extend from a bottomside of the outer shallow trench isolation material 308 to a bottomside of the second backside OPL 1802.

FIG. 18D illustrates a cross-section of the semiconductor structure at cross-section indicator Y2. In the illustrated embodiment, an etching process is performed to remove portions of the third ILD 1302 between backside source/drain contacts 1402A-1402B, and between backside source/drain contact 1402C and dielectric fill material 1102. In this manner, the second set of backside recesses 1804A-1804B can provide access to contact surfaces of the backside source/drain contacts 1402A-1402C.

Figures 19A, 19B, 19C, 19D:
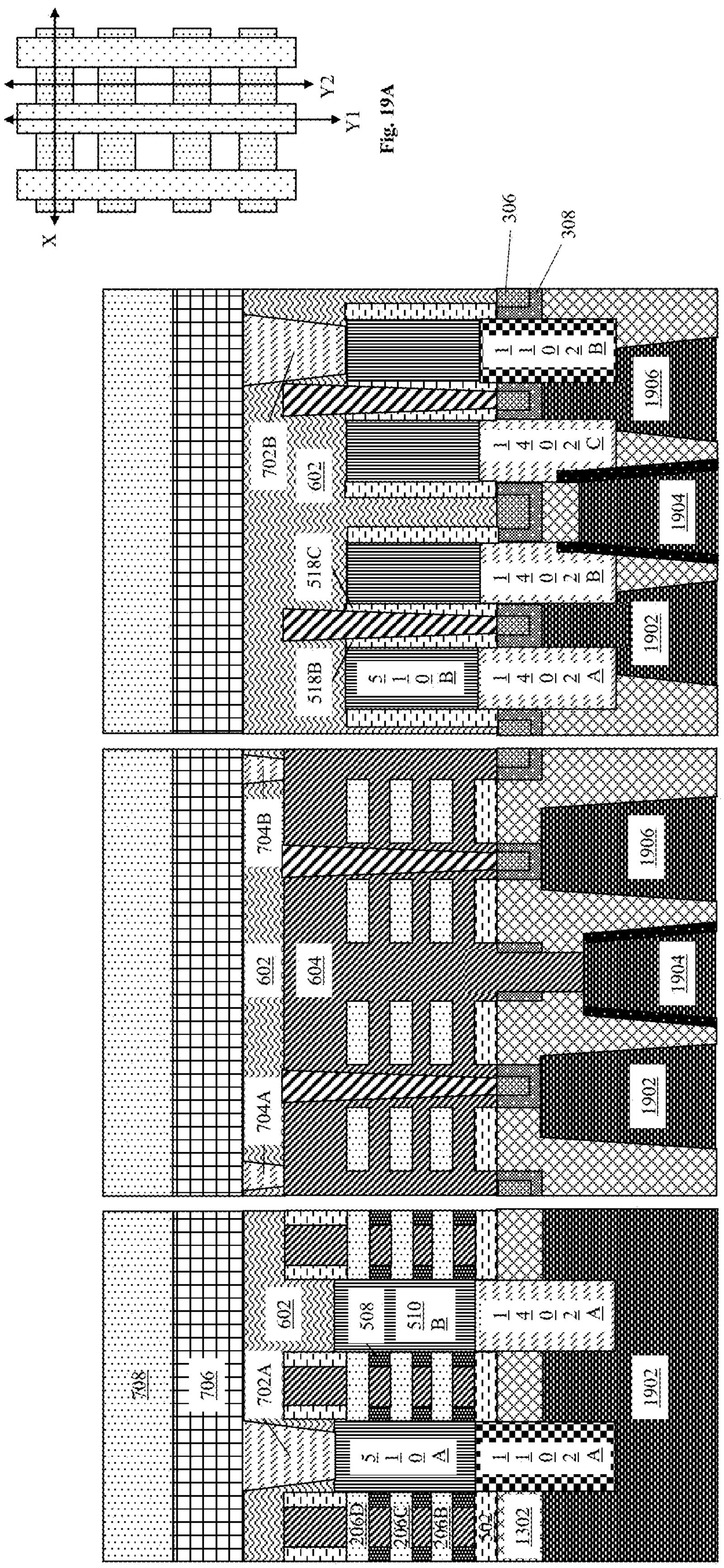
FIGS. 19A, 19B, 19C, and 19D illustrate a top view and cross-sectional views of a semiconductor structure under fabrication, according to one embodiment.

FIGS. 19A, 19B, 19C, and 19D illustrate a top view and cross-sectional views of a semiconductor structure under fabrication, according to one embodiment. FIG. 19A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

FIG. 19B illustrates a cross-section of the semiconductor structure at cross-section indicator X. In the illustrated embodiment, the second backside OPL 1802 is removed, and a power rail layer is formed on a bottomside of the third ILD 1302, the dielectric fill material 1102A and backside source/drain contact 1402A. The power rail layer can include materials such as silicon carbide (SiC), gallium nitride (GaN), gallium oxide ($Ga_2O_3$), diamond, tungsten (W), ruthenium (Ru), and copper (Cu), or the like.

FIG. 19C illustrates a cross-section of the semiconductor structure at cross-section indicator Y1. In the illustrated embodiment, the power rail layer occupies the second set of backside recesses 1804A-1804B and the ILD cavity 1502 (from which the second backside OPL 1802 was removed). In one embodiment, a portion of the power rail layer that occupies backside recess 1804A forms a first backside power rail connection (e.g., $V_{DD}$ 1902). A portion of the power rail layer that occupies backside recess 1804B forms a second backside power rail connection (e.g., Vss 1906).

A portion of the power rail layer that occupies the ILD cavity 1502 forms a signal wire connection 1904. In one embodiment, the signal wire connection 1904 can be used to transmit a gate clock signal. As shown, the gate extension region 620 provides additional spacing in the third ILD 1302 such that the signal wire connection 1904 can be connected to the high-k metal gate material 604, while maintaining space to avoid forming a short between the signal wire, and the first backside power rail connection (e.g., $V_{DD}$ 1902) or the second backside power rail connection (e.g., Vss 1906).

FIG. 19D illustrates a cross-section of the semiconductor structure at cross-section indicator Y2. In the illustrated embodiment, the first backside power rail connection (e.g., $V_{DD}$ 1902) is connected to backside source/drain contacts 1402A and 1402B. The signal wire connection 1904 is in contact with the first ILD 102. The second backside power rail connection (e.g., Vss) can be in contact with backside source/drain contact 1402C and dielectric fill material 1102B.

FIGS. 20A, 20B, 20C, and 20D illustrate a top view and cross-sectional views of a semiconductor structure under fabrication, according to one embodiment. FIG. 20A illustrates a top view of the semiconductor structure. In the illustrated embodiment, cross-section indicator X is shown traversing an active region of the semiconductor structure along an x-axis. Cross-section indicators Y1-Y2 are shown traversing various locations of the semiconductor structure along the y-axis.

FIG. 20B illustrates a cross-section of the semiconductor structure at cross-section indicator X. FIG. 20C illustrates a cross-section of the semiconductor structure at cross-section indicator Y1. FIG. 20D illustrates a cross-section of the semiconductor structure at cross-section indicator Y2.

In one embodiment, a backside interconnect layer is disposed on a bottom side of the power rail layer. In this manner, the semiconductor structure can prevent shorts from forming between the first backside power rail connection (e.g., $V_{DD}$ 1902), the signal wire connection 1904, and the second backside power rail connection (e.g., Vss 1906), despite the smaller physical dimensions of the semiconductor structure.

Various embodiments of the present disclosure are described herein with reference to the related drawings. Alternative embodiments can be devised without departing from the scope of this disclosure. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Embodiments of the present disclosure may reference an interlayer dielectric (ILD) material. The ILD material can be an insulating material used to electrically isolate different layers of a semiconductor structure. The ILD material can be $SiO_2$, SiN, a low-k dielectric material, or an ultra-low-k dielectric material. Low-k dielectric materials can generally include dielectric materials having a k value of about 3.9 or less. The ultralow-k dielectric material generally includes dielectric materials having a k value less than 2.5. Unless otherwise noted, all k values mentioned in the present application are measured relative to a vacuum. Ultra-low-k dielectric materials can include porous materials such as porous organic silicate glasses, porous polyamide nanofoams, silica xerogels, porous hydrogen silsequioxane (HSQ), porous methylsilsesquioxane (MSQ), porous inorganic materials, porous CVD materials, porous organic materials, or combinations thereof. The ultra-low-k dielectric material can be produced using a templated process or a sol-gel process. In the templated process, a precursor typically contains a composite of thermally labile and stable materials. After film deposition, the thermally labile materials can be removed by thermal heating, leaving pores in the dielectric film. In the sol gel process, porous low-k dielectric films can be formed by hydrolysis and polycondensation of an alkoxide(s) such as tetraetehoxysilane (TEOS).

Embodiments of the present disclosure may reference p-type or n-type semiconductor structures. "P-type" can refer to the addition of impurities to an intrinsic semiconductor that creates deficiencies of valence electrons. In a silicon-containing substrate, examples of p-type dopants (i.e., impurities) include, but are not limited to, boron, aluminum, gallium, and indium. "N-type" can refer to the addition of impurities that contributes free electrons to an intrinsic semiconductor. In a silicon containing substrate examples of n-type dopants (i.e., impurities) include, but are not limited to, antimony, arsenic and phosphorous.

Various processes used to form a semiconductor structure that will be packaged into an IC fall into four general categories: film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, transistors can be built and wired together to form the circuitry of a modern semiconductor device.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation, or the like. Afterwards, the exposed photoresist is developed utilizing a conventional resist development process.

Following the development step, the etching step can be performed to transfer the pattern from the patterned photoresist into the interlayer dielectric. The etching step used in forming the at least one opening can include a dry etching process (e.g., reactive ion etching, ion beam etching, plasma etching, or laser ablation), a wet chemical etching process, or any combination thereof.

While the foregoing is directed to embodiments of the present disclosure, other and further embodiments of the present disclosure may be devised without departing from the basic scope thereof, and the scope thereof is determined by the claims that follow.

The invention claimed is:

1. A method comprising:

forming a first set of trenches in a semiconductor structure, wherein forming the first set of trenches further forms a first set of fin structures;

depositing outer shallow trench isolation material in the first set of trenches;

depositing inner shallow trench isolation material over the outer shallow trench isolation material in the first set of trenches;

forming a gate based on the first set of trenches and the first set of fin structures; and forming power rail connections in contact with the gate and the outer shallow trench isolation material, wherein a signal wire connection of the power rail connections is in contact with a gate extension region of the gate, the gate extension region extends beyond bottom surfaces of the outer shallow trench isolation material and the inner shallow trench isolation material.

2. The method of claim 1, wherein the semiconductor structure includes:

a silicon substrate;

a first sacrificial layer disposed on the silicon substrate, wherein the first sacrificial layer includes SiGe25%;

a silicon layer disposed on the first sacrificial layer;

a silicon etch stop disposed on the silicon layer, wherein the silicon etch stop includes SiGe55%;

a second sacrificial layer disposed on the silicon etch stop;

a first nanosheet layer disposed on the second sacrificial layer;

a third sacrificial layer disposed on the first nanosheet layer;

a second nanosheet layer disposed on the third sacrificial layer;

a fourth sacrificial layer disposed on the second nanosheet layer; and a third nanosheet layer disposed on the fourth sacrificial layer.

3. The method of claim 2, further comprising:

depositing a frontside organic planarization layer over the third nanosheet layer, the inner shallow trench isolation material, and the outer shallow trench isolation material;

forming a backside gate connection recess in a trench of the first set of trenches;

depositing dummy gate material over the third nanosheet layer, the first set of trenches, the first set of fin structures, and the backside gate connection recess;

depositing a hardmask over the dummy gate material;

removing portions of the hardmask and dummy gate material to form a second set of fin structures; and depositing sidewall spacers on opposing surfaces of fins of the second set of fin structures.

4. The method of claim 3, further comprising:

forming a second set of trenches in the semiconductor structure between fins of the second set of fin structures;

removing the silicon etch stop;

filling a space formed by the removal of the silicon etch stop with a spacer material to form a self-aligned gate isolation layer;

removing a portion of the second sacrificial layer, a portion of the third sacrificial layer, and a portion of the fourth sacrificial layer;

depositing inner spacer material in spaces formed by the removed portion of the second sacrificial layer, removed portion of the third sacrificial layer, and removed portion of the fourth sacrificial layer;

growing a set of placeholders in the second set of trenches;

growing a set of source/drain regions over the set of placeholders; and forming a set of source/drain spacers on opposing surfaces of source/drain regions of the set of source/drain regions.

5. The method of claim 4, further comprising:

removing the hardmask;

removing the dummy gate material;

depositing a high-k metal gate material in a space formed by the removal of the dummy gate material, wherein the high-k metal gate material forms the gate extension region;

forming a set of gate cuts in the high-k metal gate material, wherein the set of gate cuts separate the high-k-metal gate material into multiple gates, wherein the set of gate cuts extend from a topside of the high-k metal gate material to the inner shallow trench isolation material, and wherein gate cuts of the set of gate cuts are in contact with at least two of the set of source/drain spacers; and depositing an interlayer dielectric over the set of source/drain regions.

6. The method of claim 5, further comprising:

disposing source/drain contacts on at least two source/drain regions of the set of source/drain regions;

disposing gate contacts on at least two of the multiple gates;

disposing a back-end-of-line interconnect on the interlayer dielectric, the source/drain contacts, and the gate contacts; and bonding the semiconductor structure to a carrier wafer, wherein the carrier wafer is disposed on the back-end-of-line interconnect.

7. The method of claim 6, further comprising:

removing the silicon substrate to expose the first sacrificial layer;

removing the first sacrificial layer to expose the silicon layer and the set of placeholders;

depositing a first backside organic planarization layer on a bottomside of the silicon layer and a bottomside of the set of placeholders;

forming a first set of backside recesses in the first backside organic planarization layer;

removing at least one of the placeholders via the first set of backside recesses;

removing the first backside organic planarization layer; and depositing a dielectric fill material in spaces formed by the removal of the placeholders, wherein the dielectric fill material includes SiN.

8. The method of claim 7, further comprising:

removing the silicon layer to expose the self-aligned gate isolation layer, the dielectric fill material, and remaining placeholders of the set of placeholders;

depositing first backside interlayer dielectric in a space formed by the removal of the silicon layer;

removing the remaining placeholders; and forming a set of backside source/drain contacts in a space formed by the removal of the remaining placeholders, wherein the set of backside source/drain contacts is contact with the set of source/drain regions, and wherein the set of backside source drain contacts includes a first backside source/drain contact, a second backside source/drain contact, and a third backside source/drain contact.

9. The method of claim 8, further comprising:

depositing a second backside interlayer dielectric over the first backside interlayer dielectric to form an extended interlayer dielectric;

forming an interlayer dielectric cavity in the extended interlayer dielectric, wherein the interlayer dielectric cavity is connected to the gate extension region, the second backside source/drain contact, and the third backside source/drain contact;

removing a portion of the second backside source/drain contact and the third backside source/drain contact; and depositing cavity spacers in the interlayer dielectric cavity, wherein the cavity spacers extend from a space formed by the removal of the portion of the second backside source/drain contact and the third backside source/drain contact, along sides of the interlayer dielectric cavity, and to a bottomside of the extended interlayer dielectric.

10. The method of claim 9, further comprising:

depositing a second backside organic planarization layer;

removing a portion of the extended interlayer dielectric;

forming a second set of backside recesses in the second backside organic planarization layer and a remaining portion of the extended interlayer dielectric;

removing the second backside organic planarization layer;

forming the power rail connections, wherein the power rail connections include a first connection in contact with the first backside source/drain contact and the second backside source/drain contact, the signal wire connection, and a second connection in contact with the third backside source/drain contact and the dielectric fill material; and disposing a backside interconnect on a bottomside of the power rail connections and the extended interlayer dielectric.

11. A semiconductor structure, comprising:

a set of backside source/drain contacts, wherein the set of backside source/drain contacts include a first backside source/drain contact, a second backside source/drain contact, and a third backside source/drain contact;

a gate that includes a gate extension region;

power rail connections that include a signal wire connection in contact with the gate extension region and a first interlayer dielectric, wherein the gate extension region extends from the gate to the signal wire connection, and wherein the signal wire connection is electrically isolated from the second backside source/drain contact and the third backside source/drain contact; and signal wire spacers disposed on sides of the signal wire connection, wherein the signal wire spacers are in contact with the first interlayer dielectric, an extended interlayer dielectric, the second backside source/drain contact, and the third backside source/drain contact.

12. The semiconductor structure of claim 11, wherein the power rail connections further include a first connection in contact with the first backside source/drain contact, the second backside source/drain contact, an outer shallow trench isolation material and the extended interlayer dielectric, and wherein the first connection can transfer a first power signal.

13. The semiconductor structure of claim 12, wherein the power rail connections further include a second connection in contact with the third backside source/drain contact, a dielectric fill material, the outer shallow trench isolation material, and the extended interlayer dielectric, and wherein the second connection can transfer a second power signal.

14. The semiconductor structure of claim 13, wherein signal wire connection is electrically isolated from the first connection and the second connection, wherein the signal wire connection can transfer a gate clock signal, and wherein the signal wire spacers are further disposed in recesses formed in the second backside source/drain contact and the third backside source/drain contact.

15. The semiconductor structure of claim 14, wherein the power rail connections and the extended interlayer dielectric are disposed on a backside interconnect.

16. The semiconductor structure of claim 15, wherein an inner shallow trenched isolation material is disposed on the outer shallow trench isolation material, wherein the inner shallow trench isolation material includes $SiO_2$, and wherein the outer shallow trench isolation material includes SiN.

17. The semiconductor structure of claim 16, wherein the gate includes a high-k metal gate material, nanosheets, and a gate cut, wherein the gate is disposed on a self-aligned gate isolation layer, the inner shallow trench isolation material, the outer shallow trench isolation material, and the signal wire connection.

18. The semiconductor structure of claim 17, wherein a set of source/drain regions and a second interlayer dielectric are disposed on the set of backside source/drain contacts and the dielectric fill material, and wherein the dielectric fill includes SiN.

19. The semiconductor structure of claim 18, wherein gate contacts and the second interlayer dielectric are disposed on the gate.

20. The semiconductor structure of claim 19, wherein a back end of line interconnect is disposed on the gate contacts and the second interlayer dielectric, and wherein a carrier wafer is disposed on the back end of line interconnect.

* * * * *